United States Patent
Takeda et al.

(10) Patent No.: US 9,691,906 B2
(45) Date of Patent: Jun. 27, 2017

(54) METHOD FOR PRODUCING THIN FILM TRANSISTOR

(71) Applicant: JOLED INC., Tokyo (JP)

(72) Inventors: Eiji Takeda, Osaka (JP); Takahiro Kawashima, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/028,966

(22) PCT Filed: Jul. 1, 2014

(86) PCT No.: PCT/JP2014/003507
§ 371 (c)(1),
(2) Date: Apr. 13, 2016

(87) PCT Pub. No.: WO2015/059850
PCT Pub. Date: Apr. 30, 2015

(65) Prior Publication Data
US 2016/0276492 A1    Sep. 22, 2016

(30) Foreign Application Priority Data

Oct. 24, 2013   (JP) .................................. 2013-221113

(51) Int. Cl.
*H01L 21/00*    (2006.01)
*H01L 21/16*    (2006.01)
(Continued)

(52) U.S. Cl.
CPC .... *H01L 29/78696* (2013.01); *H01L 21/0262* (2013.01); *H01L 21/02472* (2013.01);
(Continued)

(58) Field of Classification Search
CPC ......... H01L 21/02632; H01L 29/78696; H01L 29/66969
(Continued)

(56) References Cited

U.S. PATENT DOCUMENTS 8,299,461 B2    10/2012  Tanaka et al.
8,319,217 B2    11/2012  Kim et al.
(Continued)

FOREIGN PATENT DOCUMENTS

JP    2010-140919    6/2010
JP    2010-287735    12/2010
(Continued)

OTHER PUBLICATIONS

International Search Report (ISR) from International Searching Authority (Japan Patent Office) in International Pat. Appl. No. PCT/JP2014/003507, dated Sep. 9, 2014.
(Continued)

*Primary Examiner* — David S Blum
(74) *Attorney, Agent, or Firm* — Greenblum & Bernstein, P.L.C.

(57) ABSTRACT

A method for producing a thin film transistor including an oxide semiconductor layer includes: depositing an oxide semiconductor film above a substrate by a sputtering method; and forming the oxide semiconductor layer into a predetermined shape by processing the oxide semiconductor film, wherein in the depositing of an oxide semiconductor film, a first oxide semiconductor film is deposited by using a first power density, and a second oxide semiconductor film is then deposited on the first oxide semiconductor film by using a second power density different from the first power density.

11 Claims, 13 Drawing Sheets

(51) Int. Cl.
*H01L 29/786* (2006.01)
*H01L 29/66* (2006.01)
*H01L 21/02* (2006.01)
*H01L 27/32* (2006.01)

(52) U.S. Cl.
CPC .. *H01L 21/02483* (2013.01); *H01L 21/02554* (2013.01); *H01L 21/02565* (2013.01); *H01L 21/02631* (2013.01); *H01L 29/66969* (2013.01); *H01L 29/78693* (2013.01); *H01L 27/3244* (2013.01); *H01L 27/3262* (2013.01)

(58) Field of Classification Search
USPC ........................................................ 438/104
See application file for complete search history.

(56) References Cited

U.S. PATENT DOCUMENTS

| | | | |
|---|---|---|---|
| 8,344,373 | B2 | 1/2013 | Sato et al. |
| 8,368,067 | B2 | 2/2013 | Uchiyama et al. |
| 8,748,215 | B2 | 6/2014 | Yamazaki |
| 9,029,852 | B2 | 5/2015 | Honda et al. |
| 9,093,542 | B2 | 7/2015 | Maeda et al. |
| 9,379,248 | B2 | 6/2016 | Maeda et al. |
| 2010/0140614 | A1 | 6/2010 | Uchiyama et al. |
| 2010/0213459 | A1* | 8/2010 | Shimada ........... H01L 29/78606 257/43 |
| 2010/0314618 | A1 | 12/2010 | Tanaka et al. |
| 2011/0073856 | A1 | 3/2011 | Sato et al. |
| 2011/0127521 | A1 | 6/2011 | Yamazaki |
| 2013/0082262 | A1 | 4/2013 | Honda et al. |
| 2014/0054588 | A1 | 2/2014 | Maeda et al. |
| 2014/0080241 | A1 | 3/2014 | Aonuma |
| 2014/0319512 | A1 | 10/2014 | Maeda et al. |
| 2014/0349443 | A1 | 11/2014 | Yamazaki |
| 2015/0214382 | A1 | 7/2015 | Honda et al. |

FOREIGN PATENT DOCUMENTS

| | | |
|---|---|---|
| JP | 2011-135066 | 7/2011 |
| JP | 2011-181803 | 9/2011 |
| JP | 2012-049211 | 3/2012 |
| JP | 2013-041944 | 2/2013 |
| JP | 2013-084940 | 5/2013 |
| JP | 2013-207100 | 10/2013 |
| WO | 2009/034953 | 3/2009 |
| WO | 2011/039853 | 4/2011 |
| WO | 2012/144557 | 10/2012 |

OTHER PUBLICATIONS

Office Action from Japan Patent Office (JPO) in Japanese Patent Appl. No. 2015-543687, dated Apr. 28, 2017.

* cited by examiner

FIG. 3

|  | First oxide semiconductor film | | Second oxide semiconductor film | |
| --- | --- | --- | --- | --- |
|  | Power density (W/cm²) | Thickness (nm) | Power density (W/cm²) | Thickness (nm) |
| Comparative Example 1-1 | 1.9 | 60 | — | — |
| Comparative Example 1-2 | 2.2 | 60 | — | — |
| Example 1-1 | 1.9 | 60 | 0.62 | 2 |
| Example 1-2 | 1.9 | 60 | 0.93 | 2 |
| Example 1-3 | 1.9 | 60 | 1.2 | 2 |
| Example 1-4 | 1.9 | 60 | 2.2 | 2 |
| Example 1-5 | 1.9 | 60 | 2.5 | 2 |

|  | Variations in film quality (normalized to Comparative Example 1-1) | | |
|---|---|---|---|
|  | Signal intensity | $\tau 1$ | $\tau 2$ |
| Comparative Example 1-1 | 1 | 1 | 1 |
| Comparative Example 1-2 | 1.02 | 0.98 | 1.01 |
| Example 1-1 | 1.05 | 1.56 | 1.38 |
| Example 1-2 | 0.98 | 1.34 | 1.17 |
| Example 1-3 | 0.83 | 0.92 | 1.18 |
| Example 1-4 | 0.66 | 0.84 | 0.97 |
| Example 1-5 | 0.74 | 1.12 | 1.09 |

|  | First oxide semiconductor film | | Second oxide semiconductor film | |
| --- | --- | --- | --- | --- |
|  | Power density (W/cm²) | Thickness (nm) | Power density (W/cm²) | Thickness (nm) |
| Comparative Example 2-1 | — | — | 1.9 | 60 |
| Example 2-1 | 0.62 | 2 | 1.9 | 60 |
| Example 2-2 | 1.2 | 2 | 1.9 | 60 |
| Example 2-3 | 2.2 | 2 | 1.9 | 60 |
| Example 2-4 | 2.5 | 2 | 1.9 | 60 |

|  | Variations in film quality (normalized to Comparative Example 2-1) | | |
| --- | --- | --- | --- |
|  | Signal intensity | τ1 | τ2 |
| Comparative Example 2-1 | 1 | 1 | 1 |
| Example 2-1 | 0.73 | 0.44 | 0.73 |
| Example 2-2 | 0.94 | 0.95 | 1.02 |
| Example 2-3 | 1.05 | 1.29 | 0.99 |
| Example 2-4 | 1.01 | 1.28 | 0.97 |

FIG. 12

| | First oxide semiconductor film | | Second oxide semiconductor film | | Third oxide semiconductor film | | Fourth oxide semiconductor film | |
|---|---|---|---|---|---|---|---|---|
| | Power density (W/cm²) | Thickness (nm) | Power density (W/cm²) | Thickness (nm) | Power density (W/cm²) | Thickness (nm) | Power density (W/cm²) | Thickness (nm) |
| Comparative Example 3-1 (monolayer structure) | 1.9 | 90 | — | — | — | — | — | — |
| Example 3-1 (two-layer structure) | 0.77 | 8 | 1.9 | 80 | — | — | — | — |
| Example 3-2 (three-layer structure) | 0.77 | 8 | 1.2 | 20 | 1.9 | 60 | — | — |
| Example 3-3 (four-layer structure) | 0.77 | 8 | 1.2 | 20 | 1.5 | 30 | 1.9 | 30 |
| Example 3-4 (four-layer structure) | 0.77 | 5 | 1.2 | 20 | 1.5 | 30 | 1.9 | 30 |
| Example 3-5 (four-layer structure) | 0.77 | 4 | 1.2 | 20 | 1.5 | 30 | 1.9 | 30 |

FIG. 13

| | Variations in film quality (normalized to Comparative Example 3-1) | | |
|---|---|---|---|
| | Signal intensity | τ1 | τ2 |
| Comparative Example 3-1 (monolayer structure) | 1 | 1 | 1 |
| Example 3-1 (two-layer structure) | 0.40 | 0.46 | 0.58 |
| Example 3-2 (three-layer structure) | 0.46 | 0.33 | 0.45 |
| Example 3-3 (four-layer structure) | 0.40 | 0.19 | 0.33 |

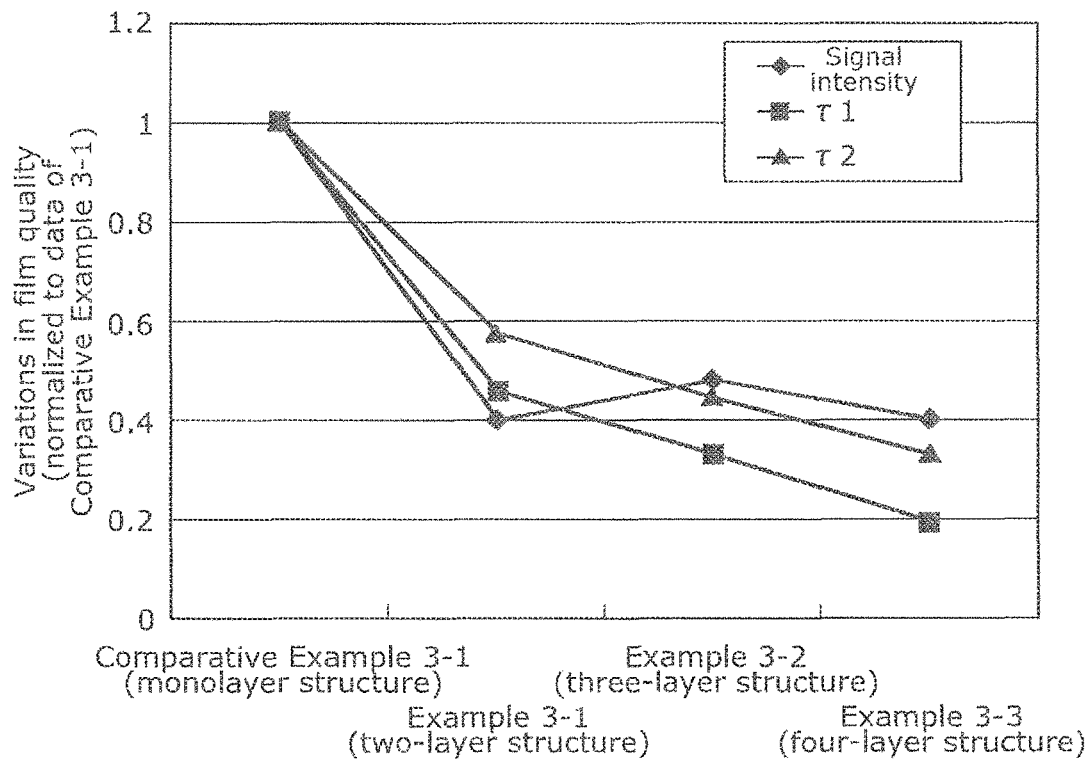

| | Variations in film quality (normalized to Comparative Example 3-3) | | |
|---|---|---|---|
| | Signal intensity | τ1 | τ2 |
| Example 3-3 (four-layer structure) | 1 | 1 | 1 |
| Example 3-4 (four-layer structure) | 0.83 | 1.02 | 0.89 |
| Example 3-5 (four-layer structure) | 0.83 | 1.01 | 0.87 |

US 9,691,906 B2

METHOD FOR PRODUCING THIN FILM TRANSISTOR

TECHNICAL FIELD

The present disclosure relates to a method for producing a thin film transistor.

BACKGROUND ART

In active matrix type display apparatuses such as liquid crystal display apparatuses or organic electroluminescence (EL) display apparatuses, thin film transistors (TFTs) are widely used as switching elements or driving elements.

In recent years, techniques that use an oxide semiconductor for a channel layer of a thin film transistor have been studied. For example, PTL 1 discloses a technique for depositing an oxide semiconductor film by using a sputtering method.

CITATION LIST

Patent Literature

[PTL 1] Japanese Unexamined Patent Application Publication No. 2010-140919

SUMMARY OF INVENTION

Technical Problem

However, such a conventional method is problematic in that the oxide semiconductor film has significant variations in its film quality and thus has poor in-plane uniformity.

It is an object of the present disclosure to provide a method for producing a thin film transistor that can deposit an oxide semiconductor film having small variations in the film quality.

Solution to Problem

In order to achieve the above object, an aspect of a method for producing a thin film transistor is a method for producing a thin film transistor including an oxide semiconductor layer, the method including: depositing an oxide semiconductor film above a substrate by a sputtering method; and forming the oxide semiconductor layer into a predetermined shape by processing the oxide semiconductor film, wherein in the depositing of an oxide semiconductor film, a first oxide semiconductor film is deposited by using a first power density, and a second oxide semiconductor film is then deposited on the first oxide semiconductor film by using a second power density different from the first power density.

Advantageous Effects of Invention

According to the present disclosure, it is possible to reduce variations in the film quality of an oxide semiconductor film and deposit an oxide semiconductor film having excellent in-plane uniformity.

BRIEF DESCRIPTION OF DRAWINGS

FIG. 3 is a diagram showing power densities used to deposit a plurality of types of oxide semiconductor films in Embodiment 1 and thicknesses of the oxide semiconductor films.

FIG. 12 is a diagram showing the power densities used to deposit oxide semiconductor films included in each of a plurality of types of semiconductor oxide layers in Embodiment 3 and the thicknesses of the oxide semiconductor films.

FIG. 13 is a diagram showing variations in the film quality of each of a plurality of oxide semiconductor layers of Embodiment 3 having different layer structures.

FIG. 14 is a diagram showing variations in the film quality of each of the plurality of oxide semiconductor layers of Embodiment 3 having different layer structures.

FIG. 15 is a diagram showing variations in the film quality of each of four-layer structure oxide semiconductor layers of Embodiment 3.

DESCRIPTION OF EMBODIMENTS

Figure 1:
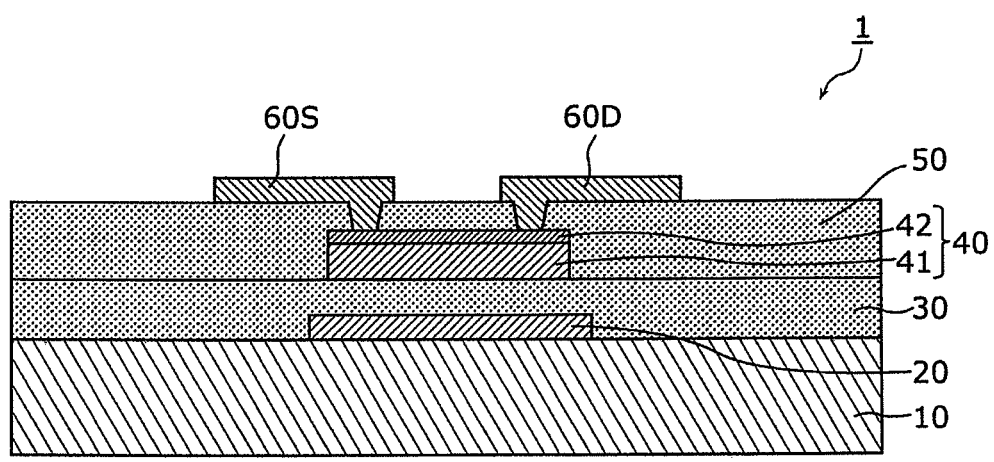
FIG. 1 is a cross-sectional view of a thin film transistor according to Embodiment 1.

Hereinafter, embodiments of the present disclosure will be described with reference to the drawings. Note, however, that each of the embodiments described below shows specific preferable examples of the present invention. Accordingly, the numerical values, shapes, materials, structural elements, the arrangement and connection of the structural elements, steps, the processing order of the steps etc. shown in the following embodiments are mere examples, and therefore do not limit the scope of the claims. Thus, among the structural elements in the following embodiments, structural elements not recited in any one of the independent claims, which represent the broadest concept, are described as arbitrary structural elements.

The diagrams are schematic diagrams, and thus are not necessarily drawn to scale. In addition, in the diagrams, the same reference numerals are given to substantially the same structural elements, and a redundant description is omitted or simplified.

(Embodiment 1)

Hereinafter, a thin film transistor 1 according to Embodiment 1 and a method for producing the thin film transistor will be described.

[Configuration of Thin Film Transistor 1]

First, a configuration of the thin film transistor 1 according to Embodiment 1 will be described with reference to FIG. 1. FIG. 1 is a cross-sectional view of the thin film transistor 1 according to Embodiment 1.

As shown in FIG. 1, the thin film transistor 1 is a TFT having an oxide semiconductor layer as a channel layer, and includes a substrate 10, a gate electrode 20, a gate insulation film 30, an oxide semiconductor layer 40, an insulation layer 50, a source electrode 60S, and a drain electrode 60D. The thin film transistor 1 according to the present embodiment is a channel-protected bottom-gate TFT, and employs a top-contact structure.

Hereinafter, structural elements of the thin film transistor 1 according to the present embodiment will be described in detail.

The substrate 10 is, for example, a glass substrate, but the substrate 10 is not limited to a glass substrate, and may be a resin substrate or the like. Also, the substrate 10 may be, instead of a rigid substrate, a flexible substrate in the form of a sheet or film such as a flexible glass substrate or a flexible resin substrate. An undercoat layer may be formed on a surface of the substrate 10.

The gate electrode 20 is a monolayer or multilayer structure electrode made of a conductive material, and is formed in a predetermined shape on the substrate 10. As the material of the gate electrode 20, it is possible to use, for example, a metal such as molybdenum, aluminum, copper, tungsten, titanium, manganese, chromium, tantalum, niobium, silver, gold, platinum, palladium, indium, nickel or neodymium, or an alloy thereof (molybdenum tungsten alloy, or the like). The materials of the gate electrode 20 are not limited thereto, and it is also possible to use a conductive metal oxide such as indium tin oxide (ITO), aluminum-doped zinc oxide (AZO), gallium-doped zinc oxide (GZO), or a conductive polymer such as polythiophene or polyacetylene.

The gate insulation film 30 is deposited between the gate electrode 20 and the oxide semiconductor layer 40. For example, the gate insulation film 30 is deposited on the gate electrode 20 formed on the substrate 10. The gate insulation film 30 is, for example, a monolayer film such as a silicon oxide film, a silicon nitride film, a silicon oxynitride film, an aluminum oxide film, a tantalum oxide film or a hafnium oxide film, or a stacked film thereof.

The oxide semiconductor layer 40 serves as the channel layer of the thin film transistor 1, and is formed in a predetermined shape on the gate insulation film 30 at a position opposing the gate electrode 20. For example, the oxide semiconductor layer 40 is formed in an island form on the gate insulation film 30 above the gate electrode 20.

The oxide semiconductor layer 40 is a stacked structure in which a first oxide semiconductor layer 41 and a second oxide semiconductor layer 42 are stacked. The first oxide semiconductor layer 41 is formed on the gate insulation film 30, and the second oxide semiconductor layer 42 is formed on the first oxide semiconductor layer 41.

In the present embodiment, the first oxide semiconductor layer 41 has a thickness greater than that of the second oxide semiconductor layer 42. In other words, the thickness of the second oxide semiconductor layer 42 is smaller than that of the first oxide semiconductor layer 41. For example, the thickness of the first oxide semiconductor layer 41 is 10 nm or more, and the thickness of the second oxide semiconductor layer 42 is 5 nm or less.

Note that the first oxide semiconductor layer 41 and the second oxide semiconductor layer 42 are deposited by using the same material, but as will be described later, different power densities are used at the time of deposition of these layers.

As the material of the first oxide semiconductor layer 41 and the second oxide semiconductor layer 42, for example, a transparent amorphous oxide semiconductor (TAOS) is used. In the present embodiment, $InGaZnO_X$ (IGZO), which is an oxide containing indium (In), gallium (Ga) and zinc (Zn), is used as the material of the first oxide semiconductor layer 41 and the second oxide semiconductor layer 42.

A thin film transistor including a transparent amorphous oxide semiconductor as a channel layer has high carrier mobility, and thus is suitable for use in a high definition display apparatus having a large screen. In addition, the transparent amorphous oxide semiconductor can be obtained by low-temperature deposition, and thus the layer can be easily formed on a flexible substrate.

The insulation layer 50 is deposited on the gate insulation film 30 so as to cover the oxide semiconductor layer 40. The insulation layer 50 functions as a protective film (channel protective layer) for protecting the oxide semiconductor layer 40. The insulation layer 50 is a monolayer film such as a silicon oxide film, a silicon nitride film, a silicon oxynitride film or an aluminum oxide film, or a stacked film thereof.

A silicon oxide film produces less amount of hydrogen during deposition as compared with a silicon nitride film. Accordingly, as a result of using a silicon oxide film as the insulation layer 50, the degradation in performance of the oxide semiconductor layer 40 caused by hydrogen reduction can be suppressed. Furthermore, as a result of forming an aluminum oxide film as the insulation layer 50, hydrogen and oxygen generated in an upper layer can be blocked by the aluminum oxide film. Considering these factors, as the insulation layer 50, it is preferable to use, for example, a stacked film having a three-layer structure including a silicon oxide film, an aluminum oxide film and a silicon oxide film.

Also, in the insulation layer 50, openings (contact holes) are formed so as to pass through a portion of the insulation layer 50. The oxide semiconductor layer 40 is connected to the source electrode 60S and the drain electrode 60D via the openings of the insulation layer 50.

The source electrode 60S and the drain electrode 60D are formed in a predetermined shape on the insulation layer 50, so as to be connected to the oxide semiconductor layer 40. Specifically, each of the source electrode 60S and the drain electrode 60D is connected to the second oxide semiconductor layer 42 via the openings formed in the insulation layer 50. Also, the source electrode 60S and the drain electrode 60D are disposed so as to be opposed to and spaced apart from each other in a horizontal direction of the substrate.

The source electrode 60S and the drain electrode 60D are monolayer or multilayer structure electrodes made of a conductive material. As the material of the source electrode 60S and the drain electrode 60D, for example, aluminum, tantalum, molybdenum, tungsten, silver, copper, titanium, chromium or the like is used. As an example, the source electrode 60S and the drain electrode 60D may be electrodes having a three-layer structure in which a molybdenum film (Mo film), a copper film (Cu film) and a copper-manganese alloy film (CuMn film) are formed in sequence from the bottom.

[Method for Manufacturing Thin Film Transistor 1]

Figure 2:
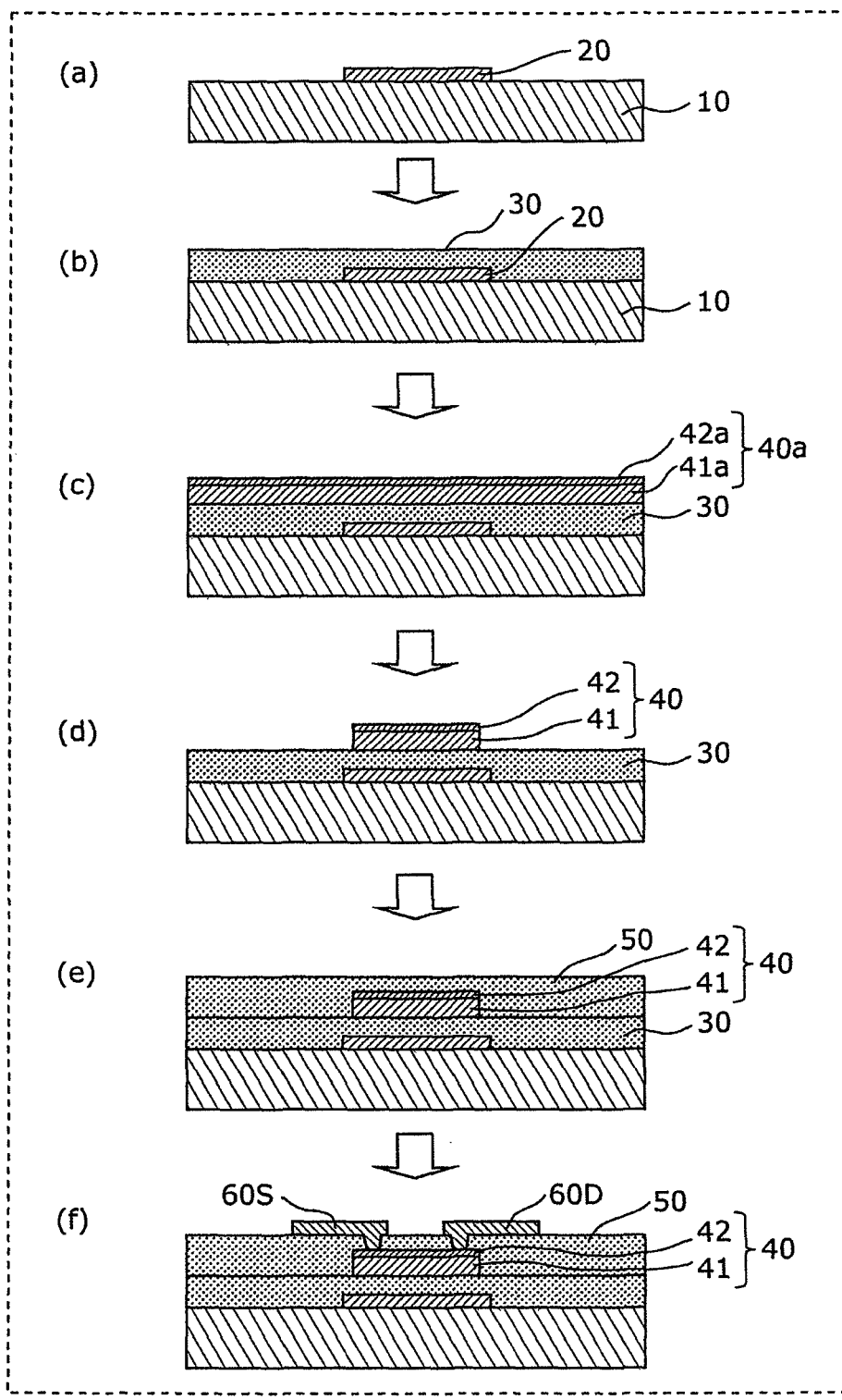
FIG. 2 is a cross-sectional view showing the steps of a method for producing a thin film transistor according to Embodiment 1.

Next, a method for producing a thin film transistor 1 according to Embodiment 1 will be described with reference to FIG. 2. FIG. 2 is a cross-sectional view showing the steps of the method for producing a thin film transistor 1 according to Embodiment 1.

First, as shown in (a) of FIG. 2, a substrate 10 is provided, and a gate electrode 20 having a predetermined shape is formed above the substrate 10. For example, a metal film is deposited on the substrate 10 by a sputtering method, and the metal film is processed by a photolithography method and a wet etching method to form a gate electrode 20 having a predetermined shape. Note that an undercoat layer may be formed on a surface of the substrate 10 before the gate electrode 20 is formed.

Next, as shown in (b) of FIG. 2, a gate insulation film 30 is formed on the gate electrode 20. In the present embodiment, the gate insulation film 30 is deposited over the substrate 10 so as to cover the gate electrode 20. In the case where an undercoat layer is formed on the surface of the substrate 10, the gate electrode 20 is formed on the undercoat layer.

The gate insulation film 30 is, for example, a silicon oxide film. In this case, the silicon oxide film can be deposited by a plasma chemical vapor deposition (CVD) method by using silane gas ($SiH_4$) and nitrous oxide gas ($N_2O$) as an introduced gas.

The gate insulation film 30 may be a monolayer film, or may be a stacked film. For example, it is possible to use, as the gate insulation film 30, a stacked film in which a silicon nitride film and a silicon oxide film are deposited in sequence. The silicon nitride film can be deposited by a plasma CVD method by using, for example, silane gas ($SiH_4$), ammonia gas ($NH_3$), and nitrogen gas ($N_2$) as an introduced gas.

Next, as shown in (c) of FIG. 2, an oxide semiconductor film 40a is deposited above the substrate 10. Specifically, a first oxide semiconductor film 41a and a second oxide semiconductor film 42a are deposited as the oxide semiconductor film 40a on the gate insulation film 30 by a sputtering method.

In this case, first, the first oxide semiconductor film 41a is deposited by sputtering with a first power density (electric power density), and the second oxide semiconductor film 42a is then deposited on the first oxide semiconductor film 41a by sputtering with a second power density that is different from the first power density.

In the present embodiment, the oxide semiconductor film 40a is deposited such that the thickness of the first oxide semiconductor film 41a, which is a lower layer, is greater than that of the second oxide semiconductor film 42a, which is an upper layer. In other words, the oxide semiconductor film 40a is deposited such that the thickness of the second oxide semiconductor film 42a is smaller than that of the first oxide semiconductor film 41a. For example, the thickness of the first oxide semiconductor film 41a is 10 nm or more, and the thickness of the second oxide semiconductor film 42a is 5 nm or less.

The material of the first oxide semiconductor film 41a and the second oxide semiconductor film 42a is a transparent amorphous oxide semiconductor, namely, $InGaZnO_X$. In this case, in each of the step of depositing the first oxide semiconductor film 41a and the step of depositing the second oxide semiconductor film 42a, In, Ga and Zn are used in a target material, an inert gas such as argon (Ar) gas is introduced into a vacuum chamber, and at the same time, a gas containing oxygen ($O_2$) is introduced as a reactive gas, and a voltage at a predetermined power density is applied to the target material. By doing so, a transparent amorphous InGaZnO film can be deposited.

The deposition of the first oxide semiconductor film 41a and the second oxide semiconductor film 42a can be performed continuously in the same vacuum apparatus. For example, the first oxide semiconductor film 41a is deposited using the first power density, and thereafter, the power density is changed, and then, the second oxide semiconductor film 42a is deposited using the second power density. In this case, the first oxide semiconductor film 41a and the second oxide semiconductor film 42a are continuously deposited without breaking the vacuum.

Changing the power density from the first power density to the second power density may be performed such that the power density is changed gradually in an analog manner, or the power density may be switched from the first power density to the second power density in a digital manner.

In the case where the first oxide semiconductor film 41a and the second oxide semiconductor film 42a are deposited continuously, if the deposition is continued while plasma (Ar plasma) discharge is performed, the plasma within the vacuum chamber may not be stabilized, and as a result, an oxide semiconductor film having the desired film quality may not be obtained. Particularly when the power density is switched in a digital manner while plasma discharge is performed, the plasma cannot be stabilized immediately after the power density is switched, and thus, if an oxide semiconductor film having a thickness of several nanometers is deposited, an oxide semiconductor film having the desired film quality may not be obtained.

Accordingly, even in the case where the first oxide semiconductor film 41a and the second oxide semiconductor film 42a are deposited continuously within the same chamber, it is preferable to, after the first oxide semiconductor film 41a has been deposited, temporarily stop the plasma discharge, then switch the power density, and thereafter start the plasma discharge again. In particular, in the present embodiment, because the thickness of the second oxide semiconductor film 42a is 5 nm or less, it is preferable to temporarily stop the plasma discharge and then switch the power density.

Also, when, as in the present embodiment, the first oxide semiconductor film 41a and the second oxide semiconductor film 42a are deposited continuously in the same chamber without breaking the vacuum, the interface between the first oxide semiconductor film 41a and the second oxide semiconductor film 42a is unlikely to appear. Particularly when the power density is gradually changed in an analog manner, the interface between the first oxide semiconductor film 41a and the second oxide semiconductor film 42a is unlikely to appear.

Accordingly, in this case, the oxide semiconductor film 40a can be regarded as a single film composed of two layers having different film qualities (the first oxide semiconductor film 41a and the second oxide semiconductor film 42a). That is, the oxide semiconductor film 40a can be regarded as a layer including a bulk layer (the first oxide semiconductor layer 41) and a surface layer (the second oxide semiconductor layer 42) whose quality is improved with respect to the bulk layer.

In the present embodiment, the first oxide semiconductor film 41a and the second oxide semiconductor film 42a are deposited continuously in the same chamber, but the configuration is not limited thereto. For example, the first oxide semiconductor film 41a and the second oxide semiconductor film 42a may be deposited in separate sputtering apparatuses.

A detailed relationship between the film quality of the oxide semiconductor film 40a and the power densities used to deposit the first oxide semiconductor film 41a and the second oxide semiconductor film 42a and the thicknesses of the oxide semiconductor films will be described later.

Next, as shown in (d) of FIG. 2, the oxide semiconductor film 40a is processed into a predetermined shape, thereby forming an oxide semiconductor layer 40 having a predetermined shape.

For example, the oxide semiconductor film 40a can be processed into an oxide semiconductor layer 40 having a predetermined shape by using a photolithography method and a wet etching method. Specifically, first, a resist is formed on the oxide semiconductor film 40a (the second oxide semiconductor film 42a), and the resist is processed such that the resist remains at a position opposing the gate electrode 20. Then, the oxide semiconductor film 40a in the region where the resist is not formed is removed by etching. By doing so, an island-like oxide semiconductor layer 40 can be formed at a position opposing the gate electrode 20.

In the case where the oxide semiconductor film 40a is made of InGaZnO, for example, a chemical solution obtained by mixing phosphoric acid ($H_3PO_4$), nitric acid ($HNO_3$), acetic acid ($CH_3COOH$) and water may be used as the etching solution.

In the present embodiment, the oxide semiconductor film 40a is a stacked film composed of the first oxide semiconductor film 41a and the second oxide semiconductor film 42a. Accordingly, by patterning the oxide semiconductor film 40a, the island-like oxide semiconductor layer 40 can be formed as the stacked film composed of the first oxide semiconductor layer 41 and the second oxide semiconductor layer 42.

Since the first oxide semiconductor film 41a and the second oxide semiconductor film 42a are patterned simultaneously, the first oxide semiconductor layer 41 and the second oxide semiconductor layer 42 are patterned in the same shape.

Next, as shown in (e) of FIG. 2, an insulation layer 50 is formed on the oxide semiconductor layer 40. In the present embodiment, the insulation layer 50 is deposited over the gate insulation film 30 so as to cover the oxide semiconductor layer 40.

The insulation layer 50 is, for example, a silicon oxide film. In this case, the silicon oxide film can be deposited by a plasma CVD method by using silane gas ($SiH_4$) and nitrous oxide gas ($N_2O$) as an introduced gas.

Next, contact holes are formed in the insulation layer 50 so as to expose a portion of the oxide semiconductor layer 40. In the present embodiment, a portion of the second oxide semiconductor layer 42 is exposed by forming contact holes in the insulation layer 50. Specifically, by etching and removing a portion of the insulation layer 50 by a photolithography method and an etching method, contact holes are formed on regions of the oxide semiconductor layer 40 that serve as a source contact region and a drain contact region.

For example, in the case where the insulation layer 50 is a silicon oxide film, the contact holes can be formed in the silicon oxide film by a dry etching method such as a reactive ion etching (RIE) method. In this case, for example, carbon tetrafluoride ($CF_4$) and oxygen gas ($O_2$) can be used as the etching gas.

Next, as shown in (f) of FIG. 2, a source electrode 60S and a drain electrode 60D connected to the oxide semiconductor layer 40 are formed. For example, the source electrode 60S and the drain electrode 60D having a predetermined shape are formed on the insulation layer 50 so as to fill the contact holes formed in the insulation layer 50.

In the present embodiment, as the source electrode 60S and the drain electrode 60D, electrodes having a three-layer structure including a Mo film, a Cu film, and a CuMn film are formed. In this case, first, the Mo film, the Cu film, and the CuMn film are sequentially deposited on the insulation layer 50 by a sputtering method so as to fill the contact holes in the insulation layer 50. After that, the stacked film of the Mo film, the Cu film, and the CuMn film is patterned by a photolithography method and a wet etching method. By doing so, the source electrode 60S and the drain electrode 60D having a predetermined shape can be formed.

As the etching solution used to etch the stacked film including the Mo film, the Cu film and the CuMn film, for example, a chemical solution obtained by mixing a hydrogen peroxide solution ($H_2O_2$) and an organic acid can be used.

Through the above process, a thin film transistor 1 having the configuration shown in FIG. 1 can be produced.

[Relationship between Sputtering Conditions for Oxide Semiconductor Films and Variations in Film Quality]

Next, an experiment regarding sputtering conditions and variations in film quality, which was performed on the oxide semiconductor film 40a of the thin film transistor 1 according to the present embodiment, will be described below.

In this experiment, a plurality of types of oxide semiconductor films 40a (each including a first oxide semiconductor film 41a and a second oxide semiconductor film 42a) were deposited by a sputtering method by changing the power density, and variations in the film quality of each of the oxide semiconductor films 40a were evaluated. A specific method for depositing the oxide semiconductor films 40a was the same as that described above.

Also, in this experiment, $InGaZnO_4$ films were deposited as the oxide semiconductor films 40a (each including a first oxide semiconductor film 41a and a second oxide semiconductor film 42a) by setting the substrate temperature to room temperature and the gas flow ratio so as to satisfy $O_2/(Ar+O_2)=5\%$. Note that the conditions for depositing the oxide semiconductor films 40a were not changed except for the power density.

FIG. 3 shows the power densities used to deposit the plurality of types of oxide semiconductor films 40a and the thicknesses thereof. Note that, in the present embodiment, all of the oxide semiconductor films 40a were formed such that thickness t1 of the first oxide semiconductor film 41a was greater than thickness t2 of the second oxide semiconductor film 42a (t1>t2).

Specifically, as shown in FIG. 3, in Comparative Examples 1-1 and 1-2, only first oxide semiconductor films 41a having a thickness of 60 nm were deposited by setting the power density to 1.9 and 2.2 (W/cm$^2$), respectively.

Also, in Examples 1-1 to 1-5, first oxide semiconductor films 41a having a thickness of 60 nm were deposited by setting the power density to 1.9 (W/cm$^2$), and thereafter second oxide semiconductor films 42a having a thickness of 2 nm were deposited by changing the power density to the following five patterns: 0.62, 0.93, 1.2, 2.2 and 2.5 (W/cm$^2$), respectively.

Note that the thickness t2 of the second oxide semiconductor film 42a is a thickness (assumed thickness) assumed based on the sputtering conditions, and the durations (second) of deposition process were set to about 4 (seconds), about 3 (seconds), about 2 (seconds), about 1 (second) and about 1 (second), respectively, in Examples 1-1 to 1-5.

Variations in film quality were evaluated for the oxide semiconductor films 40a deposited as described above in two comparative examples (Comparative Examples 1-1 and 1-2) and five examples (Examples 1-1 to 1-5). In this experiment, the variations in film quality were evaluated by measuring the electric properties of the oxide semiconductor films 40a by a microwave photoconductivity decay (μ-PCD) method.

Specifically, a deposited oxide semiconductor film was irradiated with excitation light and microwaves, and the maximum value (peak value) of reflected waves from the oxide semiconductor film that change by irradiation with excitation light is measured. Thereafter, the irradiation with excitation light was stopped, and changes in the reflectance of the reflected waves after the irradiation was stopped were measured. Through the measurement as described above, the peak value of reflectance (signal intensity), the time required for the reflectance to be attenuated from the peak value to 1/e of the peak value (where e is the base of the natural logarithm) (decay time τ1), and the time required for the reflectance to be attenuated from 1/e of the peak value to 1/e$^2$ of the peak value (decay time τ2) can be calculated. Then, the variations in the film quality of the oxide semiconductor film were measured based on the calculated signal intensity, decay time τ1, and decay time τ2. Of the two different decay times, the time τ1 required for the reflectance to be attenuated from the peak value to 1/e of the peak value is the lifetime of the carrier (carrier lifetime).

The measurement principle of the μ-PCD method is as follows.

The excitation light applied to the oxide semiconductor film is absorbed by the oxide semiconductor film and generates excess carriers. When the density of the excess carriers increases, the disappearance speed of the carriers increases as well. When the generation speed of the carriers equals the disappearance speed, the density of excess carriers reaches a constant peak value. When the generation speed of excess carriers equals the disappearance speed of excess carriers as described above, saturation occurs, as a result of which the density of excess carriers is maintained at a constant value. However, when the irradiation with excitation light is stopped, the number of excess carriers decreases due to recombination and annihilation of the excess carriers, and the value finally returns to the value before the irradiation with excitation light.

On the other hand, the microwaves applied to the oxide semiconductor film are reflected at a reflectance that is based on resistivity determined by the density of free carries in the oxide semiconductor film. When excess carriers are generated by irradiation with excitation light, the resistivity of the oxide semiconductor film decreases, which increases the reflectance of microwaves accordingly. When the irradiation with excitation light is stopped, the resistivity increases as the number of excess carriers decreases, and the reflectance of microwaves decreases.

The intensity of reflected waves of the microwaves is affected by excess carriers generated in a measurement area by the irradiation with excitation light, and the degree of influence also depends on the degree of defects or the like in the measurement area. That is, the intensity of reflected waves of the microwaves applied to the oxide semiconductor film is attenuated after it is temporarily increased due to the irradiation with excitation light, but the peak value of the intensity of the reflected waves becomes smaller as the number of defects or the like in the oxide semiconductor film becomes greater, and thus the decay time (lifetime, or the like) is also shortened. Accordingly, the intensity of reflected waves of the microwaves applied to the oxide semiconductor film can be used as an indication of variations in the film quality of the oxide semiconductor film.

That is, the state of variations in the film quality of the oxide semiconductor film can be determined by observing changes in the signal intensity, the decay time τ1, and the decay time τ2 measured by the μ-PCD method. Specifically, in each of the signal intensity, the decay time τ1, and the decay time τ2, if there is a large difference between different positions in the oxide semiconductor film, it is possible to determine that the variation in film quality is large.

Figure 4A:
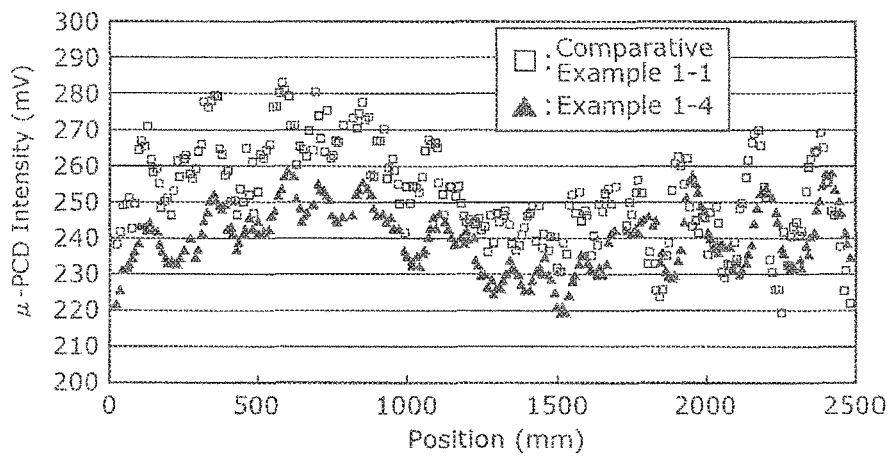
FIG. 4A is a diagram showing a distribution of signal intensity on film obtained by measuring the plurality of types of oxide semiconductor films of Embodiment 1 by a μ-PCD method.
Figure 4B:
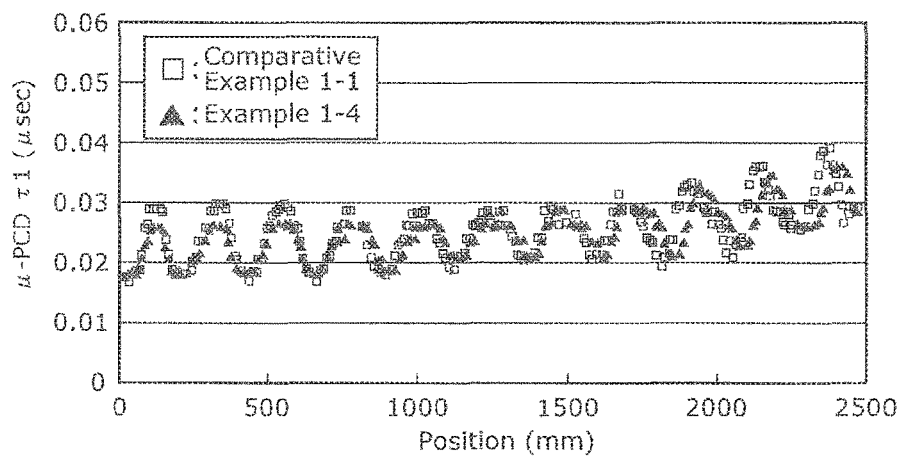
FIG. 4B is a diagram showing a distribution of decay time τ1 on film obtained by measuring the plurality of types of oxide semiconductor films of Embodiment 1 by the μ-PCD method.
Figure 4C:
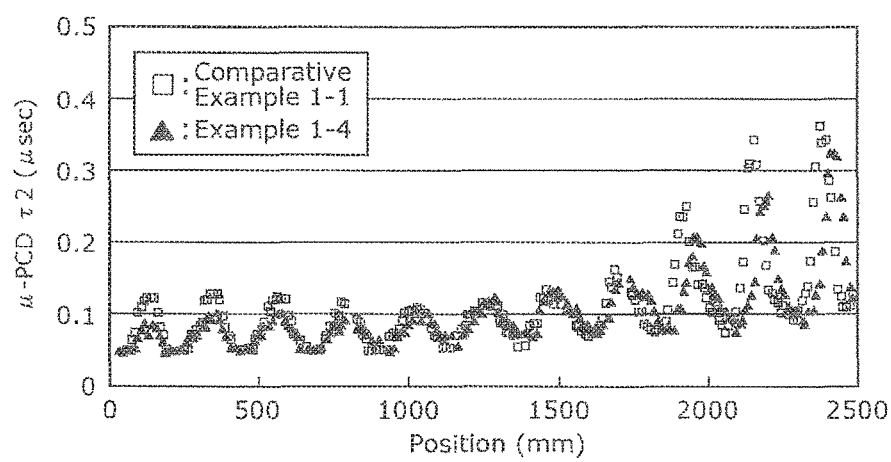
FIG. 4C is a diagram showing a distribution of decay time τ2 on film obtained by measuring the plurality of types of oxide semiconductor films of Embodiment 1 by the μ-PCD method.

As an example, the results of measurement by using the μ-PCD method versus the film position (position) of the oxide semiconductor films 40a of Comparative Example 1-1 and Example 1-4 shown in FIG. 3 are shown in FIGS. 4A, 4B and 4C. FIGS. 4A, 4B and 4C show the results of measurement of the signal intensity, the decay time τ1, and the decay time τ2, respectively. Note that FIGS. 4A, 4B and 4C show only the results of measurement performed on the oxide semiconductor films 40a of Comparative Example 1-1 and Example 1-4, but the same measurement was performed on the oxide semiconductor films 40a other than those of Comparative Example 1-1 and Example 1-4.

Figures 5, 6:
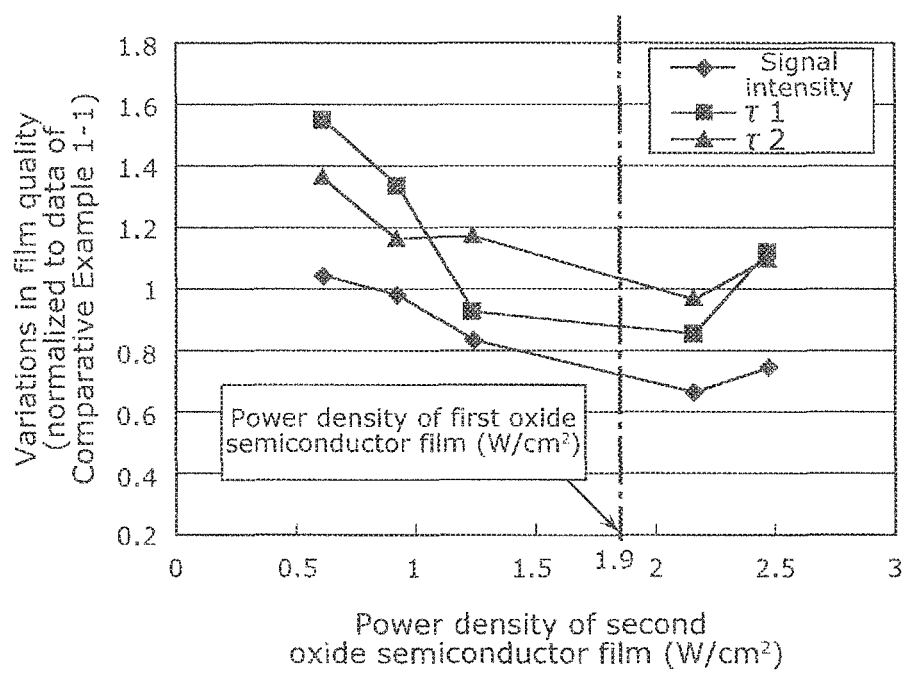
FIG. 5 is a diagram showing variations in the film quality of each of the plurality of types of oxide semiconductor films of Embodiment 1.
FIG. 6 is a diagram showing a relationship between the power density and the variations in the film quality of the oxide semiconductor films of Embodiment 1.

The variations in film quality calculated, based on the results of measurement, for the oxide semiconductor film 40a of each of the comparative examples and examples shown in FIG. 3 are shown in FIGS. 5 and 6. Note that in FIGS. 5 and 6, the variations in film quality were calculated by the following equation:

Variation in film quality=(MAX−MIN)/(MAX+MIN), where in each of the signal intensity, the decay time τ1, and the decay time τ2, MAX represents the maximum value of all measured points, and MIN represents the minimum value of all measured points.

Also, FIGS. 5 and 6 show the results of measurement of the signal intensity, the decay time τ1, and the decay time τ2, which were obtained by relatively evaluating the variations in the film quality of Comparative Example 1-2 and Examples 1-1 to 1-5, with the results normalized to Comparative Example 1-1.

As a result, it has been found that, as shown in FIGS. 5 and 6, the variations in the film quality of an oxide semiconductor film 40a can be improved by producing the oxide semiconductor film 40a by depositing a first oxide semiconductor film 41a and a second oxide semiconductor film 42a by using different power densities.

In particular, as shown in FIG. 5, it can be seen that in Example 1-4, the variations in film quality are improved in all indications of the signal intensity, the decay time τ1, and the decay time τ2. It is understood from this fact that the variations in the film quality of the oxide semiconductor film 40a can be improved significantly by setting the power density (the second power density) used to deposit the second oxide semiconductor film 42a to be greater than the power density (the first power density) used to deposit the first oxide semiconductor film 41a.

The present inventors have considered as follows the above fact that variations in film quality can be improved by depositing the oxide semiconductor film 40a by depositing films by sputtering using different power densities.

It is generally considered that the film quality of an oxide semiconductor film is degraded by defects that are present in the oxide semiconductor film. The detects of the oxide semiconductor film include those caused by oxygen deficiency or excess oxygen, and the defects caused by oxygen deficiency or excess oxygen can be reduced by an oxidation or a reduction by performing a plasma treatment after deposition of the oxide semiconductor film. In this case, it is possible to perform, as the plasma treatment, a plasma treatment using $N_2O$ or $NH_3$, which is mainly performed in a CVD deposition apparatus or the like.

Meanwhile, the detects that are present in the oxide semiconductor film are not limited to those caused by oxygen deficiency or excess oxygen, and it is considered that there are defects caused by deficiency of metal element (in the case of IGZO, for example, deficiency of In, Ga or Zn).

However, with the plasma treatment performed in a CVD deposition apparatus, it is not possible to reduce the defects caused by deficiency of metal element.

In contrast, in the present embodiment, the oxide semiconductor film is deposited by a sputtering method, and it is therefore possible to reduce the defects caused by deficiency of metal element as well. This is presumably because a metal element is also included as a target material in the plasma at the time of sputtering, and thus not only the defects caused by oxygen deficiency or excess oxygen but also defects caused by deficiency of metal element can be terminated.

Moreover, in the present embodiment, the oxide semiconductor film is deposited in a sputtering deposition apparatus, and thus the termination of the defects of the oxide semiconductor film can be performed in the same chamber (in situ) in which the oxide semiconductor film was deposited. It is thereby possible to simplify the production process and reduce the production cost.

Also, in order to effectively reduce the deficiency of metal element in the oxide semiconductor film, it is considered that the oxide semiconductor film needs to be exposed to a plasma particle flux containing a metal element at a higher density. This is because increasing the power density increases the density of the particles that reach the substrate, and the defects caused by deficiency of metal element can be efficiently terminated by depositing the oxide semiconductor film by using a higher power density.

Accordingly, the defects that are present in the oxide semiconductor film 40a can be efficiently terminated by depositing the oxide semiconductor film 40a by sputtering using different power densities. This can improve the film quality of the oxide semiconductor film 40a, thus making it possible to suppress the variations in the film quality of the oxide semiconductor film 40a in the plane of the substrate.

As shown in Comparative Examples 1-1 and 1-2, it can also be seen that this effect cannot be obtained by simply depositing a monolayer oxide semiconductor film by using a high power density. That is, the above-described effect is obtained by depositing the oxide semiconductor film 40a by using a plurality of different power densities.

For example, as in Examples 1-1 to 1-4, by setting the power density used to deposit the second oxide semiconductor film 42a to be greater than the power density used to deposit the first oxide semiconductor film 41a, the variations in the film quality of the oxide semiconductor film 40a can be suppressed.

This is presumably because the assumed thickness of the second oxide semiconductor film 42a is very small, as small as 5 nm or less, and thus the second oxide semiconductor film 42a contributes to the improvement of film quality as a surface layer of the oxide semiconductor film 40a, rather than the practically effective second oxide semiconductor film 42a being stacked on the first oxide semiconductor film 41a. That is, it is considered that by increasing the power density used to deposit the upper layer, the defects that are present in the surface layer (the second oxide semiconductor film 42a) of the oxide semiconductor film 40a can be efficiently terminated.

Also, in order to more effectively improve the film quality of the oxide semiconductor film 40a, the power density (the second power density) used to deposit the second oxide semiconductor film 42a may be set to 110% or more of the power density (the first power density) used to deposit the first oxide semiconductor film 41a.

Note, however, that there is a concern that as a result of depositing the oxide semiconductor film by using such a high power density, the particles having a high level of energy may impinge on the film surface, causing damage to the film surface. Accordingly, in consideration of this influence, it is preferable that the power density (the second power density) used to deposit the second oxide semiconductor film 42a is set to 140% or less of the power density (the first power density) used to deposit the first oxide semiconductor film 41a.

As described above, with the method for producing a thin film transistor 1 according to the present embodiment, the first oxide semiconductor film 41a and the second oxide semiconductor film 42a are deposited by sputtering using different power densities. By doing so, the variations in the film quality of the oxide semiconductor film 40a can be suppressed, and thus the oxide semiconductor film 40a having excellent in-plane uniformity can be deposited. It is therefore possible to produce a thin film transistor with less variations in TFT characteristics.

In particular, in the present embodiment, the power density (the second power density) used to deposit the second oxide semiconductor film 42a is set to be greater than the power density (the first power density) used to deposit the first oxide semiconductor film 41a. By doing so, the film quality of the oxide semiconductor film 40a can be further improved, and the variations in film quality can be further suppressed. It is therefore possible to obtain a thin film transistor with even less variations in TFT characteristics.

(Embodiment 2)

Figures 7, 8, 9:
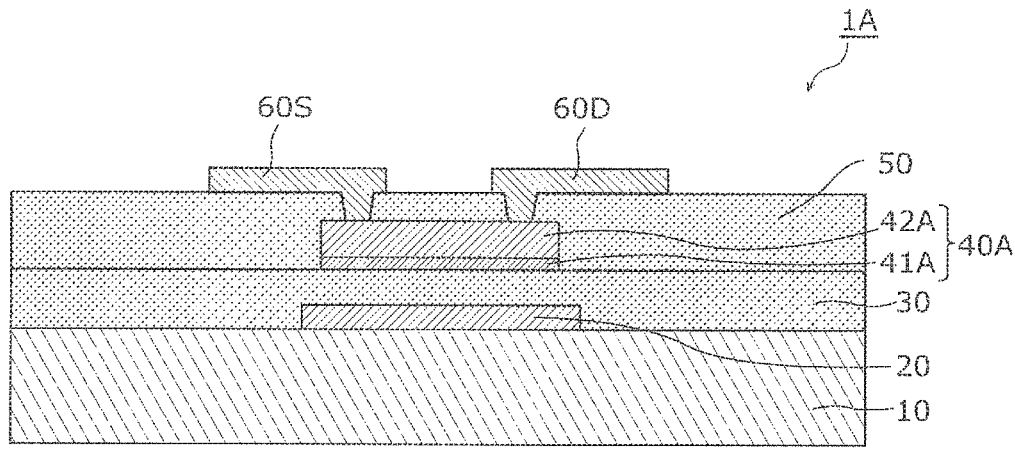
FIG. 7 is a cross-sectional view of a thin film transistor according to Embodiment 2.
FIG. 8 is a diagram showing power densities used to deposit a plurality of types of oxide semiconductor films in Embodiment 2 and thicknesses of the oxide semiconductor films.
FIG. 9 is a diagram showing variations in the film quality of each of the plurality of types of oxide semiconductor films of Embodiment 2.

Next, a thin film transistor 1A according to Embodiment 2 and a method for producing the thin film transistor will be described. FIG. 7 is a cross-sectional view of the thin film transistor 1A according to Embodiment 2.

The thin film transistor 1A according to the present embodiment is different from the thin film transistor 1 of Embodiment 1 described above in the thicknesses of the first oxide semiconductor layer and the second oxide semiconductor layer.

Specifically, in the oxide semiconductor layer 40 of Embodiment 1 described above, the thickness t2 of the second oxide semiconductor layer 42 serving as the upper layer is set to be smaller (thinner) than the thickness t1 of the first oxide semiconductor layer 41 serving as the lower layer, but in an oxide semiconductor layer 40A according to the present embodiment, the thickness t1 of a first oxide semiconductor layer 41A serving as the lower layer is set to be smaller (thinner) than the thickness t2 of a second oxide semiconductor layer 42A serving as the upper layer. In other words, the thickness of the second oxide semiconductor layer 42A is set to be greater (thicker) than the thickness of the first oxide semiconductor layer 41A.

For example, the thickness of the first oxide semiconductor layer 41A is 5 nm or less, and the thickness of the second oxide semiconductor layer 42A is 10 nm or more.

Note that the configuration of the present embodiment is the same as that of Embodiment 1 except for the thicknesses of the first oxide semiconductor layer 41A and the second oxide semiconductor layer 42B.

Also, the thin film transistor 1A according to the present embodiment can be produced by the same production method as the thin film transistor 1 of Embodiment 1, but the thicknesses of the first oxide semiconductor film 41a and the second oxide semiconductor film 42a are different from those used in Embodiment 1.

Specifically, the oxide semiconductor film 40a of Embodiment 1 described above is deposited such that the thickness t2 of the second oxide semiconductor film 42a serving as the upper layer is smaller (thinner) than the thickness t1 of the first oxide semiconductor film 41a serving as the lower layer, but the oxide semiconductor film 40a (the oxide semiconductor layer 40A) of the present embodiment is deposited such that the thickness t1 of the first oxide semiconductor film 41a serving as the lower layer is smaller (thinner) than the thickness t2 of the second oxide semiconductor film 42a serving as the upper layer.

Note that, in the present embodiment, the magnitude relationship of the power density between the first oxide semiconductor film 41a and the second oxide semiconductor film 42a is the same as that of Embodiment 1. That is, the power density (the second power density) used to deposit the second oxide semiconductor film 42a is set to be greater than the power density (the first power density) used to deposit the first oxide semiconductor film 41a. In this case, it is preferable to set the second power density to 110% or more of the first power density.

Next, an experiment regarding sputtering conditions and variations in film quality, which was performed on the oxide semiconductor film 40a of the thin film transistor 1A according to the present embodiment in the same manner as in Embodiment 1, will be described below.

In this experiment as well, a plurality of types of oxide semiconductor films 40a (each including a first oxide semiconductor film 41a and a second oxide semiconductor film 42a) were deposited by a sputtering method by changing the power density, and variations in the film quality of each of the oxide semiconductor films 40a were evaluated. Also, in this experiment as well, InGaZnO$_4$ films were deposited as the oxide semiconductor films 40a (each including a first oxide semiconductor film 41a and a second oxide semiconductor film 42a) by setting the substrate temperature to room temperature and the gas flow ratio so as to satisfy O$_2$/(Ar+ O$_2$)=5%. Note that the conditions for depositing the oxide semiconductor films 40a were not changed except for the power density.

FIG. 8 shows the power densities used to deposit the plurality of types of oxide semiconductor films 40a and the thicknesses thereof. Note that, in the present embodiment, all of the oxide semiconductor films 40a were formed such that the thickness t2 of the second oxide semiconductor film 42a was greater than the thickness t1 of the first oxide semiconductor film 41a (t2>t1).

Specifically, as shown in FIG. 8, in Comparative Example 2-1, only a second oxide semiconductor film 42a having a thickness of 60 nm was deposited by setting the power density to 1.9 (W/cm$^2$).

Also, in Examples 2-1 to 2-4, first oxide semiconductor films 41a having a thickness of 2 nm were deposited by setting the power density to the following four patterns: 0.62, 1.2, 2.2 and 2.5 (W/cm$^2$), respectively, and thereafter second oxide semiconductor films 42a having a thickness of 60 nm were deposited by changing the power density to 1.9 (W/cm$^2$).

Note that the thickness t1 of the first oxide semiconductor film 41a is a thickness (assumed thickness) assumed based on the sputtering conditions, and the durations (second) of deposition process were set to about 4 (seconds), about 2 (seconds), about 1 (second), and about 1 (second), respectively, in Examples 2-1 to 2-4.

Variations in film quality were evaluated in the same manner as in Embodiment 1 by using a μ-PCD method, for the oxide semiconductor films 40a deposited as described above in Comparative Example 2-1 and Examples 2-1 to 2-4. Specifically, the signal intensity, the decay time τ1, and the decay time τ2 were measured by using a μ-PCD method.

Figure 10:
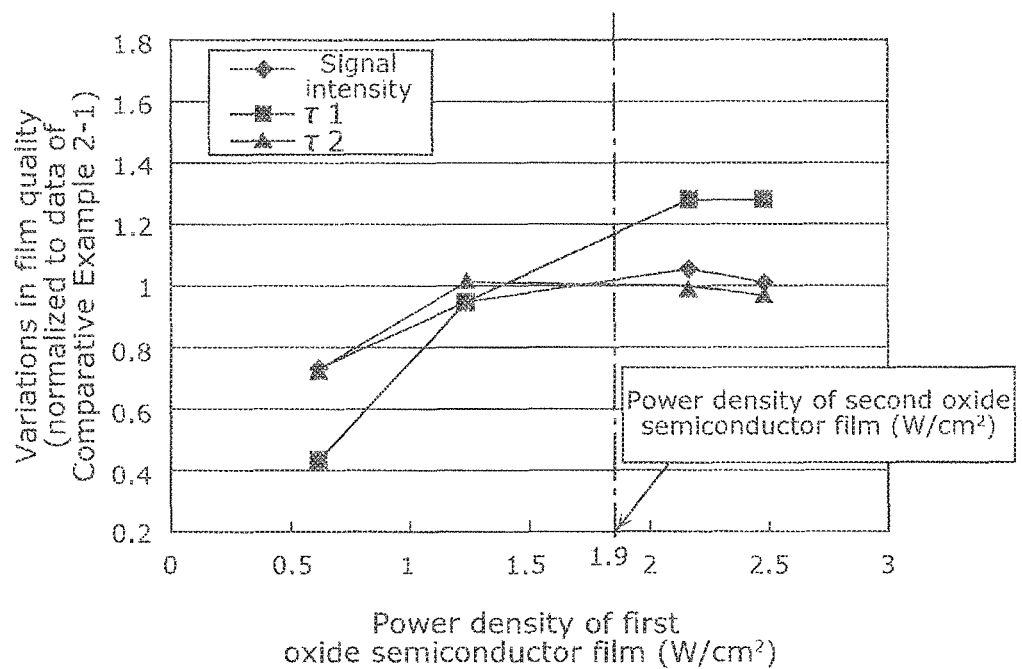
FIG. 10 is a diagram showing a relationship between the power density and the variations in the film quality of the oxide semiconductor films of Embodiment 2.

The variations in film quality calculated, based on the results of measurement, for the oxide semiconductor film 40a of each of Comparative Example 2-1 and Examples 2-1 to 2-4 shown in FIG. 8 are shown in FIGS. 9 and 10. Note that in FIGS. 9 and 10, the variations in film quality were calculated by the following equation as in Embodiment 1:

Variation in film quality=(MAX−MIN)/(MAX+ MIN).

Also, FIGS. 9 and 10 show the results of measurement of the signal intensity, the decay time τ1, and the decay time τ2, which were obtained by relatively evaluating the variations in the film quality of Examples 2-1 to 2-4, with the results normalized to Comparative Example 2-1.

As a result, as shown in FIGS. 9 and 10, it has been found that in the present embodiment as well, the variations in the film quality of an oxide semiconductor film 40a can be improved by producing the oxide semiconductor film 40a by depositing a first oxide semiconductor film 41a and a second oxide semiconductor film 42a by using different power densities.

That is, as in Embodiment 1, in the present embodiment as well, the defects that are present in the oxide semiconductor film 40a can be efficiently terminated by depositing the oxide semiconductor film 40a by the sputtering method. This can improve the film quality of the oxide semiconductor film 40a, thus making it possible to suppress the variations in the film quality of the oxide semiconductor film 40a in the plane of the substrate.

As shown in Comparative Example 2-1, it can also be seen that this effect cannot be obtained by simply depositing a monolayer oxide semiconductor film by using a high power density. That is, the above-described effect is obtained by depositing the oxide semiconductor film 40a by using a plurality of different power densities.

Also, as shown in FIG. 9, it can be seen that in Examples 2-1 and 2-2, the variations in film quality are improved in all indications of the signal intensity, the decay time τ1, and the decay time τ2, It is understood from this fact that in the present embodiment as well, the variations in the film quality of the oxide semiconductor film 40a can be improved significantly by setting the power density (the second power density) used to deposit the second oxide semiconductor film 42a to be greater than the power density (the first power density) used to deposit the first oxide semiconductor film 41a.

The present inventors have considered this point as follows.

There is oxygen deficiency on the surface of a gate insulation film, such as a silicon oxide film ($SiO_X$), serving as an underlying layer of the oxide semiconductor film. The oxygen deficiency on the surface of the gate insulation film is considered to significantly affect fluctuations in the film quality of the oxide semiconductor film as an interface defect with the oxide semiconductor film serving as a channel layer.

In the present embodiment, the first oxide semiconductor film 41a is deposited by the sputtering method, and the plasma contains oxygen. The oxygen contained in the plasma contributes to the termination of the oxygen deficiency on the surface of the gate insulation film, and thus it is considered that the interface defect on the surface of the oxide semiconductor film can be reduced.

However, when the first oxide semiconductor film 41a is deposited using a high power density, the particles of a metal element of high atomic number, such as In, impinge on the surface of the gate insulation film at a high level of energy, causing defects on the surface of the gate insulation film and reducing the effect of terminating the oxygen deficiency on the surface of the gate insulation film. Accordingly, in order to effectively reduce only the oxygen deficiency on the surface of the gate insulation film without causing the particles of the metal element to impinge on the surface of the gate insulation film to cause defects as described above, the deposition of the first oxide semiconductor film 41a is preferably performed by using a low power density.

On the other hand, when a monolayer oxide semiconductor film 40a is deposited by using only a low power density, the resulting oxide semiconductor film has a small film density and a large number of bulk defects. That is, the oxide semiconductor film has large variations in its film quality. In this case, if a thin film transistor is produced by using this oxide semiconductor film, there is a concern that deterioration of TFT characteristics such as a shift in threshold voltage or a reduction in mobility may occur.

Accordingly, it is preferable to, after a first oxide semiconductor film 41a has been deposited by using a low power density, deposit a second oxide semiconductor film 42a by using a power density higher than the power density used to deposit the first oxide semiconductor film 41a.

Also, in consideration of these effects, it is preferable that the thickness of the first oxide semiconductor film 41a is set to 5 nm or less, and the thickness of the second oxide semiconductor film 42a is set to 10 nm or more.

With this configuration, by forming the oxide semiconductor layer 40A (including the first oxide semiconductor layer 41A and the second oxide semiconductor layer 42A) by patterning the oxide semiconductor film 40a (including the first oxide semiconductor film 41a and the second oxide semiconductor film 42a) of the present embodiment, the second oxide semiconductor layer 42A, which is the upper layer, can function as a practically effective channel layer. In this case, the first oxide semiconductor layer 41 functions as a surface modification layer of the gate insulation film 30 that underlies the oxide semiconductor layer 40A, rather than forming a practically effective layer.

In consideration of damage to the gate insulation film 30 and the film quality of the oxide semiconductor layer 40A itself, the power density (the first power density) used to deposit the first oxide semiconductor film 41a may be set to 90% or less of the power density (the second power density) used to deposit the second oxide semiconductor film 42a.

As described above, with the method for producing a thin film transistor 1A according to the present embodiment, as in Embodiment 1, the first oxide semiconductor film 41a and the second oxide semiconductor film 42a are deposited by sputtering using different power densities. By doing so, the variations in the film quality of the oxide semiconductor film 40a can be suppressed, and thus the oxide semiconductor film 40a having excellent in-plane uniformity can be deposited. It is therefore possible to produce a thin film transistor with less variations in TFT characteristics.

In particular, in the present embodiment, the power density (the first power density) used to deposit the first oxide semiconductor film 41a is set to a low power density, and the power density (the second power density) used to deposit the second oxide semiconductor film 42a is set so as to be greater than the first power density. By doing so, it is possible to further suppress the variations in the film quality of the oxide semiconductor film 40a while suppressing damage to the gate insulation film 30. It is therefore possible to obtain a thin film transistor with even less variations in TFT characteristics.

(Embodiment 3)

Figure 11:
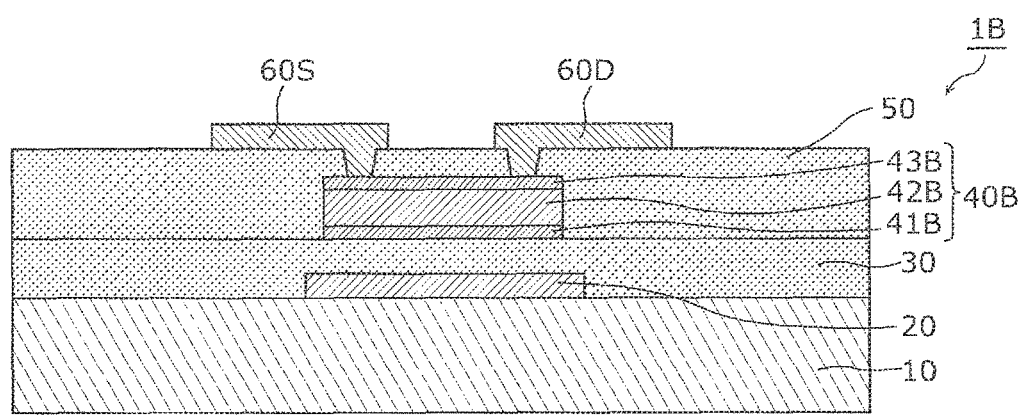
FIG. 11 is a cross-sectional view of a thin film transistor according to Embodiment 3.

A thin film transistor 1B according to Embodiment 3 and a method for producing the thin film transistor will be described next. FIG. 11 is a cross-sectional view of the thin film transistor 1B according to Embodiment 3.

The thin film transistor 1B according to the present embodiment is different from the thin film transistors 1 and 1A of Embodiments 1 and 2 described above in the layer structure of the oxide semiconductor layer. That is, specifically, the oxide semiconductor layers 40 and 40A of Embodiments 1 and 2 described above are configured to have a two-layer structure, but an oxide semiconductor layer 40B according to the present embodiment is configured to have a three-layer structure.

Specifically, the oxide semiconductor layer 40B of the present embodiment has a combined structure of the oxide semiconductor layer 40 of Embodiment 1 and the oxide semiconductor layer 40A of Embodiment 2.

That is, the oxide semiconductor layer 40B of the present embodiment has a three-layer structure including a first oxide semiconductor layer 41B, a second oxide semiconductor layer 42B, and a third oxide semiconductor layer 43B, with the first oxide semiconductor layer 41B and the second oxide semiconductor layer 42B corresponding to the first oxide semiconductor layer 41A and the second oxide semiconductor layer 42A of Embodiment 2, and the third oxide semiconductor layer 43B corresponding to the second oxide semiconductor layer 42 of Embodiment 1.

Also, in the present embodiment as well, different power densities are used to deposit the first oxide semiconductor layer 41B, the second oxide semiconductor layer 42B, and the third oxide semiconductor layer 43B by a sputtering method.

Specifically, the power densities used to deposit the first oxide semiconductor layer 41B, the second oxide semiconductor layer 42B and the third oxide semiconductor layer 43B are set so as to satisfy P1<P2<P3, where P1, P2, and P3 respectively represent the power densities for the oxide semiconductor layers.

Also, in the present embodiment, the thickness of the first oxide semiconductor layer 41B, the thickness of the second oxide semiconductor layer 42B, and the thickness of the third oxide semiconductor layer 43B are set so as to satisfy t1<t2 and t3<t2, where t1, t2, and t3 respectively represent the thicknesses of the oxide semiconductor layers.

For example, the first oxide semiconductor layer 41B and the third oxide semiconductor layer 43B have a thickness of 5 nm or less, and the second oxide semiconductor layer 42B has a thickness of 10 nm or more.

As described above, with the method for producing a thin film transistor 1B according to the present embodiment, the effects of both Embodiments 1 and 2 can be obtained. It is therefore possible to obtain the oxide semiconductor film 40a having less variations in film quality than those of Embodiments 1 and 2.

Note that, in the present embodiment, the oxide semiconductor layer is configured to have three layers, but the configuration is not limited thereto. The oxide semiconductor layer may be configured to have four or more layers.

Here, an experiment regarding sputtering conditions and variations in film quality, which was performed with respect to the number of films stacked in the oxide semiconductor layer in the same manner as in Embodiments 1 and 2, will be described below.

In this experiment, the variations in the film quality of the oxide semiconductor layer were evaluated in each of the following cases where the oxide semiconductor layer (oxide semiconductor film) has a monolayer structure, a two-layer structure, a three-layer structure, and a four-layer structure. Furthermore, in the case where the oxide semiconductor layer has a four-layer structure, the variations in film quality were evaluated by changing the thickness of the lowermost oxide semiconductor layer.

In this experiment as well, InGaZnO$_4$ films were deposited as the oxide semiconductor layers (oxide semiconductor films) by setting the substrate temperature to room temperature and the gas flow ratio so as to satisfy O$_2$/(Ar+O$_2$)=5%. The variations in film quality were calculated by the following equation as in Embodiments 1 and 2:

Variation in film quality=(MAX−MIN)/(MAX+MIN).

FIG. 12 shows the power density used to deposit each of a plurality of types of oxide semiconductor layers in this experiment and the thickness thereof.

As shown in FIG. 12, the oxide semiconductor layer formed in Comparative Example 3-1 has a monolayer structure. In Comparative Example 3-1, only a first oxide semiconductor film having a thickness of 90 nm was deposited by setting the power density to 1.9 (W/cm$^2$).

The oxide semiconductor layer of Example 3-1 has a two-layer structure. In Example 3-1, a first oxide semiconductor film having a thickness of 8 nm was deposited by setting the power density to 0.77 (W/cm$^2$), and thereafter a second oxide semiconductor film having a thickness of 80 nm was deposited by setting the power density to 1.9 (W/cm$^2$).

The oxide semiconductor layer of Example 3-2 has a three-layer structure. In Example 3-2, a first oxide semiconductor film having a thickness of 8 nm was deposited by setting the power density to 0.77 (W/cm$^2$), thereafter, a second oxide semiconductor film having a thickness of 20 nm was deposited by increasing the power density to 1.2 (W/cm$^2$), and then a third oxide semiconductor film having a thickness of 60 nm was deposited by further increasing the power density to 1.9 (W/cm$^2$).

The oxide semiconductor layer of Example 3-3 has a four-layer structure. In Example 3-3, a first oxide semiconductor film having a thickness of 8 nm was deposited by setting the power density to 0.77 (W/cm$^2$), thereafter, a second oxide semiconductor film having a thickness of 20 nm was deposited by setting the power density to 1.2 (W/cm$^2$), then, a third oxide semiconductor film having a thickness of 30 nm was deposited by increasing the power density to 1.5 (W/cm$^2$), and then a fourth oxide semiconductor film having a thickness of 30 nm was deposited by further increasing the power density to 1.9 (W/cm$^2$).

The oxide semiconductor layers of Examples 3-4 and 3-5 have a four-layer structure. In Examples 3-4 and 3-5, only the thickness of the first oxide semiconductor film was changed from that of Example 3-3, and the thickness was set to 5 nm in Example 3-4, and 4 nm in Example 3-5.

Variations in film quality were evaluated in the same manner as in Embodiments 1 and 2 by using a μ-PCD method, for the oxide semiconductor layers deposited as described above in Comparative Example 3-1 and Examples 3-1 to 3-5. Specifically, the signal intensity, the decay time τ1, and the decay time τ2 were measured by using a μ-PCD method.

First, as shown in FIGS. 13 and 14, the relationship between the number of stacked oxide semiconductor films and the variations in film quality was studied based on the results of measurement of Comparative Example 3-1, Examples 3-1, 3-2 and 3-3. FIGS. 13 and 14 show the variations in film quality calculated for the oxide semiconductor layers of Comparative Example 3-1 and Examples 3-1, 3-2 and 3-3 having different layer structures. Note that FIGS. 13 and 14 show the results of measurement of the signal intensity, the decay time τ1, and the decay time τ2, which were obtained by relatively evaluating the variations in the film quality of Examples 3-1, 3-2 and 3-3, with the results normalized to Comparative Example 3-1.

As a result, as shown in FIGS. 13 and 14, it has been found that the variations in the film quality of the oxide semiconductor layer as a whole can be improved by increasing the number of stacked oxide semiconductor films. That is, it has been found that the larger the number of stacked oxide semiconductor films, the better the uniformity in film quality is.

Figure 16:
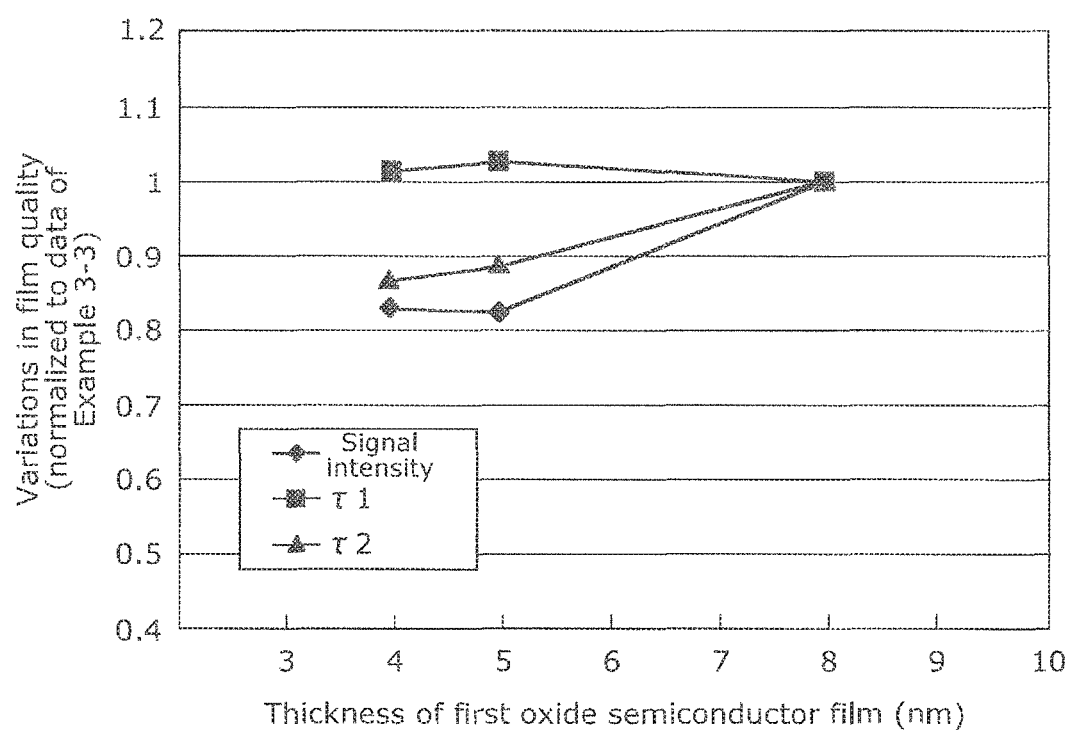
FIG. 16 is a diagram showing dependency on the thickness of a first oxide semiconductor film of the four-layer structure oxide semiconductor layers of Embodiment 3.

Next, dependency on the thickness of the first oxide semiconductor was studied for the oxide semiconductor layers having a four-layer structure, which provides the least variations in the film quality. Specifically, the study was conducted based on the results of measurement of Examples 3-3, 3-4 and 3-5. FIGS. 15 and 16 show the variations in film quality calculated for each of the four-layer structure oxide semiconductor layers of Examples 3-3, 3-4 and 3-5. Note that FIGS. 15 and 16 show the results of measurement of the signal intensity, the decay time τ1, and the decay time τ2, which were obtained by relatively evaluating the variations in the film quality of Examples 3-4 and 3-5, with the results normalized to Comparative Example 3-3.

As a result, as shown in FIGS. 15 and 16, it has been found that the variations in film quality can be improved when the thickness of the first oxide semiconductor film is made thinner. That is, it has been found that the thinner the lowermost oxide semiconductor film, the better the uniformity in film quality is.

Figure 17A:
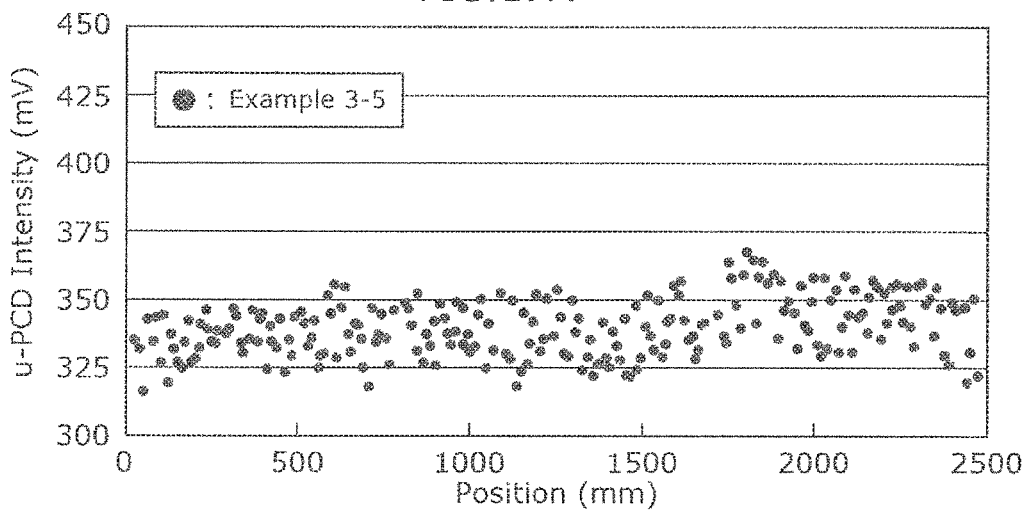
FIG. 17A is a diagram showing a distribution of signal intensity on film obtained by measuring an oxide semiconductor layer formed in Example 3-5 of Embodiment 3 by a μ-PCD method.
Figure 17B:
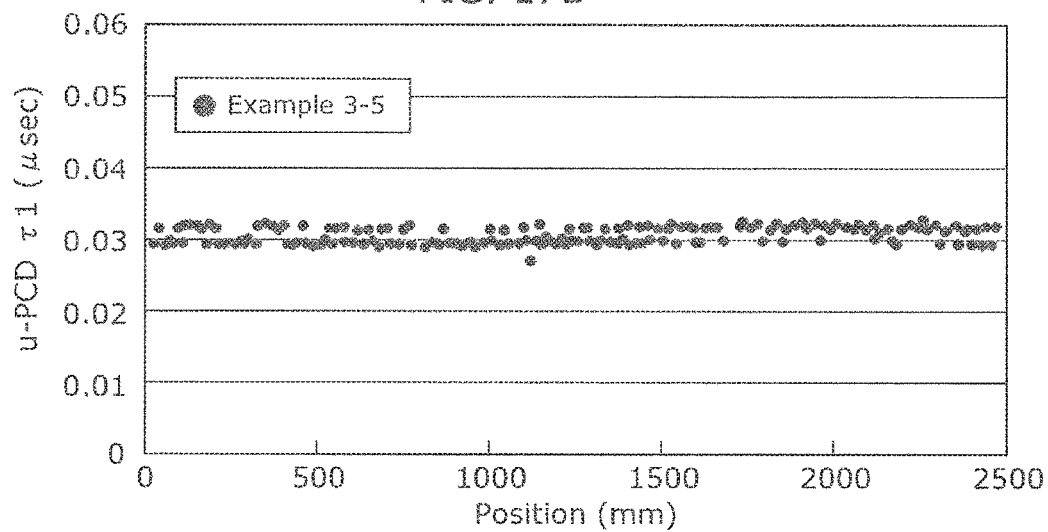
FIG. 17B is a diagram showing a distribution of decay time τ1 on film obtained by measuring the oxide semiconductor layer formed in Example 3-5 of Embodiment 3 by the μ-PCD method.
Figure 17C:
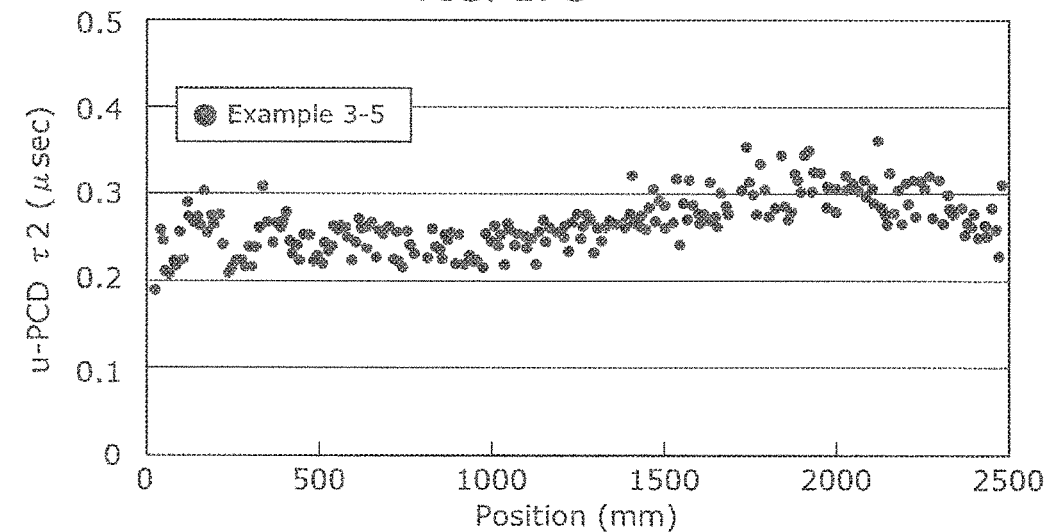
FIG. 17C is a diagram showing a distribution of decay time τ2 on film obtained by measuring the oxide semiconductor layer formed in Example 3-5 of Embodiment 3 by the μ-PCD method.

As an example, the results of measurement performed by a μ-PCD method versus the film position (position) of the oxide semiconductor layer of Example 3-5 having the least variations in the film quality among the four-layer structure oxide semiconductor layers are shown in FIGS. 17A, 17B and 17C. FIGS. 17A, 17B and 17C show the results of measurement of the signal intensity, the decay time τ1, and the decay time τ2, respectively. The variations in the film quality of Example 3-5 are calculated based on the results of measurement shown in FIGS. 17A, 17B and 17C.

(Embodiment 4)

Next, an example in which the thin film transistor 1 of Embodiment 1 described above is applied to a display apparatus will be described with reference to FIG. 18. Note that, in the present embodiment, an example of application to an organic EL display apparatus will be described.

Figure 18:
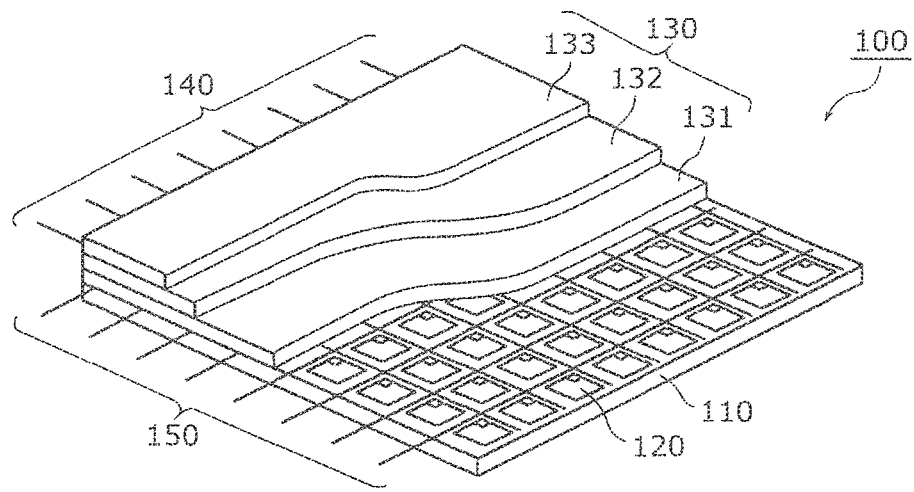
FIG. 18 is a partially cut-away perspective view of an organic EL display apparatus according to Embodiment 4.

FIG. 18 is a partially cut-away perspective view of an organic EL display apparatus according to Embodiment 4. The above-described thin film transistor 1 can be used as a switching element or a driving element of an active matrix substrate included in the organic EL display apparatus.

As shown in FIG. 18, an organic EL display apparatus 100 is constituted by a stacked structure of a TFT substrate (TFT array substrate) 110 including a plurality of thin film transistors arranged thereon, and a layer of organic EL elements (light-emitting portions) 130 that is composed of a layer of anodes 131 serving as a lower electrode (reflective electrode), EL layers (light-emitting layers) 132, and a cathode 133 serving as an upper electrode (transparent electrode).

One of the thin film transistors 1, 1A and 1B of Embodiments 1 to 3 described above is used as the TFT substrate 110 of the present embodiment. On the TFT substrate 110, a plurality of pixels 120 are arranged in a matrix, and each pixel 120 is provided with a pixel circuit.

The organic EL elements 130 are formed so as to respectively correspond to the plurality of pixels 120, and the light emitted from each of the organic EL elements 130 is controlled by the pixel circuit provided in the corresponding one of the pixels 120. The organic EL elements 130 are formed on an interlayer insulation layer (planarization film) formed so as to cover the plurality of thin film transistors.

Also, each organic EL element 130 is configured such that the corresponding EL layer 132 is disposed between the corresponding anode 131 and the cathode 133. A hole transport layer is further formed between the anode 131 and the EL layer 132, and an electron transport layer is further formed between the EL layer 132 and the cathode 133. Note that other functional layers may be provided between the anode 131 and the cathode 133. The functional layers formed between the anode 131 and the cathode 133, including the EL layer 132, are organic layers made of organic materials.

Each of the pixels 120 is driven and controlled by its pixel circuit. Also, in the TFT substrate 110, a plurality of gate lines (scanning lines) 140 disposed along the row direction of the pixels 120, a plurality of source lines (signal lines) 150 disposed along the column direction of the pixels 120 so as to intersect the gate lines 140, and a plurality of power supply lines (illustration is omitted in FIG. 18) disposed so as to be parallel to the source lines 150. Each of the pixels 120 is defined by, for example, a gate line 140 and a source line 150 orthogonally intersecting each other.

Each of the gate lines 140 is connected to the gate electrodes of first thin film transistors that operate as switching elements included in the pixel circuits provided in the corresponding row. Each of the source lines 150 is connected to the source electrodes of the first thin film transistors provided in the corresponding column. Each of the power supply lines is connected to the drain electrodes of second thin film transistors that operate as driving elements included in the pixel circuits provided in the corresponding column.

Figure 19:
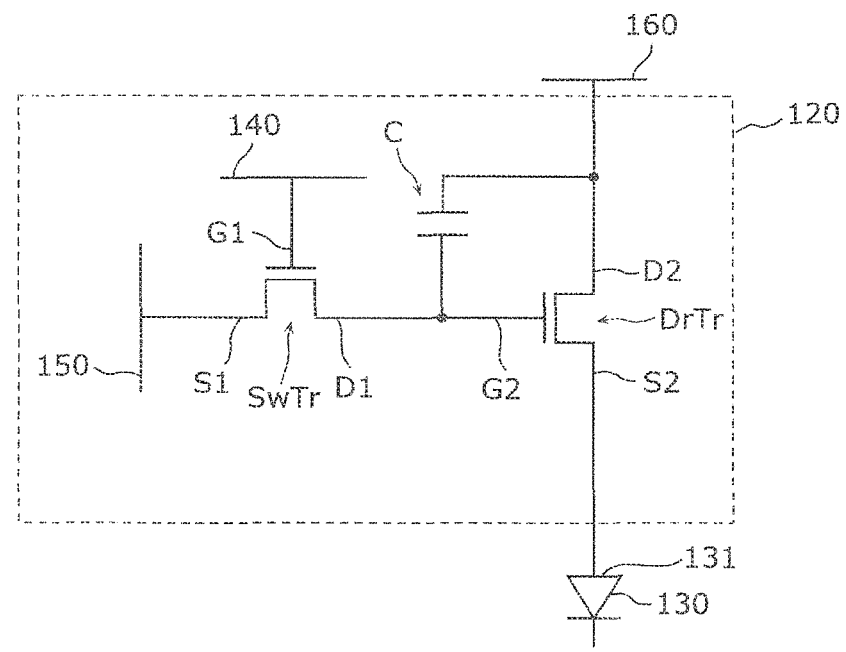
FIG. 19 is an electric circuit diagram showing an example of a configuration of a pixel circuit included in the organic EL display apparatus according to Embodiment 4.

An example of a pixel circuit included in the pixels 120 will now be described with reference to FIG. 19. FIG. 19 is an electric circuit diagram showing an example of a configuration of a pixel circuit included in the organic EL display apparatus of Embodiment 4. Note that the configuration of the pixel circuit is not limited to that shown in FIG. 19.

As shown in FIG. 19, the pixel circuit is composed of a first thin film transistor SwTr that operates as a switching element, a second thin film transistor DrTr that operates as a driving element, and a capacitor C that stores data to be displayed by the corresponding pixel 120. In the present embodiment, the first thin film transistor SwTr is a switching transistor for selecting the pixel 120, and the second thin film transistor DrTr is a driving transistor for driving the organic EL element 130.

The first thin film transistor SwTr includes a gate electrode G1 connected to the gate line 140, a source electrode S1 connected to the source line 150, a drain electrode D1 connected to the capacitor C and a gate electrode G2 of the second thin film transistor DrTr, and an oxide semiconductor layer (not shown). In the first thin film transistor SwTr, upon application of predetermined voltages to the gate line 140 and the source line 150 connected to the first thin film transistor SwTr, the voltage applied to the source line 150 is stored in the capacitor C as a data voltage.

The second thin film transistor DrTr includes a gate electrode G2 connected to the drain electrode D1 of the first thin film transistor SwTr and the capacitor C, a drain electrode D2 connected to a power supply line 160 and the capacitor C, a source electrode S2 connected to the anode 131 of the organic EL element 130, and an oxide semiconductor layer (not shown). The second thin film transistor DrTr supplies a current corresponding to the data voltage stored in the capacitor C from the power supply line 160 to the anode 131 of the organic EL element 130 via the source electrode S2. As a result, in the organic EL element 130, a driving current flows from the anode 131 to the cathode 133, causing the EL layer 132 to emit light.

As the organic EL display apparatus 100 having the above-described configuration, an active matrix type display apparatus that performs display control for each of the pixels 120 located at intersections of the gate lines 140 and the source lines 150 is used. Accordingly, the first thin film transistor SwTr and the second thin film transistor DrTr of each pixel 120 cause the corresponding organic EL element 130 to selectively emit light, and thus a desired image is displayed.

As described above, because one of the thin film transistors 1, 1A and 1B of Embodiments 1 to 3 described above is used as the TFT substrate 110 of the present embodiment, it is possible to implement a TFT array substrate having little variations in TFT characteristics and excellent substrate in-plane uniformity. Accordingly, an organic EL display apparatus having excellent display performance can be implemented.

(Modifications)

Hereinafter, thin film transistors according to Modifications 1 and 2 will be described.

(Modification 1)

Figure 20:
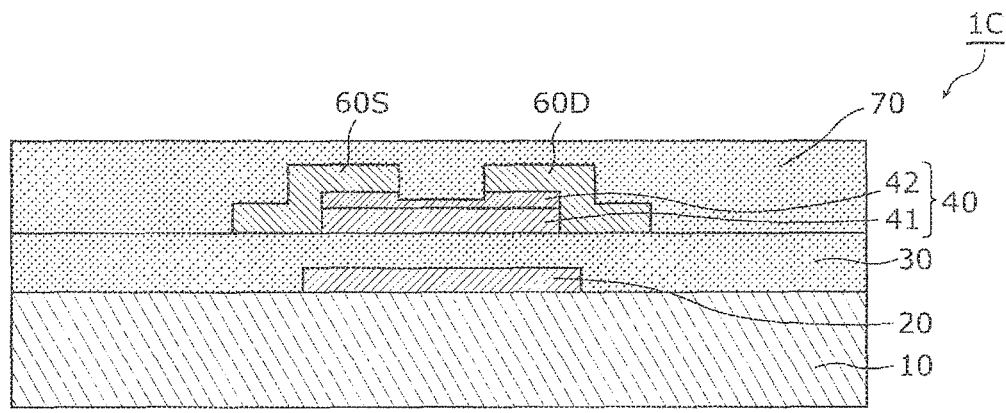
FIG. 20 is a cross-sectional view of a thin film transistor according to Modification 1.

FIG. 20 is a cross-sectional view of a thin film transistor 1C according to Modification 1.

As shown in FIG. 20, the thin film transistor 1C according to the present modification is a channel-etched bottom-gate TFT, and includes a substrate 10, a gate electrode 20, a gate insulation film 30, an oxide semiconductor layer 40, a source electrode 60S, a drain electrode 60D, and an insulation layer 70.

In the present modification, the oxide semiconductor layer 40 has the same configuration as the oxide semiconductor layer 40 of Embodiment 1. That is, the oxide semiconductor layer 40 is composed of a first oxide semiconductor layer 41 and a second oxide semiconductor layer 42. Also, the oxide semiconductor layer 40 is formed at a position opposing the gate electrode 20 and in an island form on the gate insulation film 30. The method for forming the oxide semiconductor layer 40 is the same as that of Embodiment 1.

The source electrode 60S and the drain electrode 60D are formed on the oxide semiconductor layer 40 and the gate insulation film 30 so as to respectively cover opposite ends of the oxide semiconductor layer 40.

Specifically, the source electrode 60S is formed so as to cover the upper and side surfaces of one end of the oxide semiconductor layer 40 and extend from the oxide semiconductor layer 40 to the gate insulation film 30. On the other hand, the drain electrode 60D is formed so as to cover the upper and side surfaces of the other end of the oxide semiconductor layer 40 and extend from the oxide semiconductor layer 40 to the gate insulation film 30.

The insulation layer 70 is a passivation layer, and is formed on the gate insulation film 30 so as to cover the oxide semiconductor layer 40 as well as the source electrode 60S and the drain electrode 60D.

In Embodiment 1 described above, a top-contact structure in which the insulation layer 50 is inserted between the oxide semiconductor layer 40 and the source electrode 60S and the drain electrode 60D is used, but as in the present modification, a side contact structure in which the opposite ends of the oxide semiconductor layer 40 are covered directly by the source electrode 60S and the drain electrode 60D may be used.

As described above, with the method for producing a thin film transistor 1C of the present modification, the same effects as those of Embodiment 1 can be obtained. Note that the present modification can also be applied to Embodiments 2 and 3.

(Modification 2)

Figure 21:
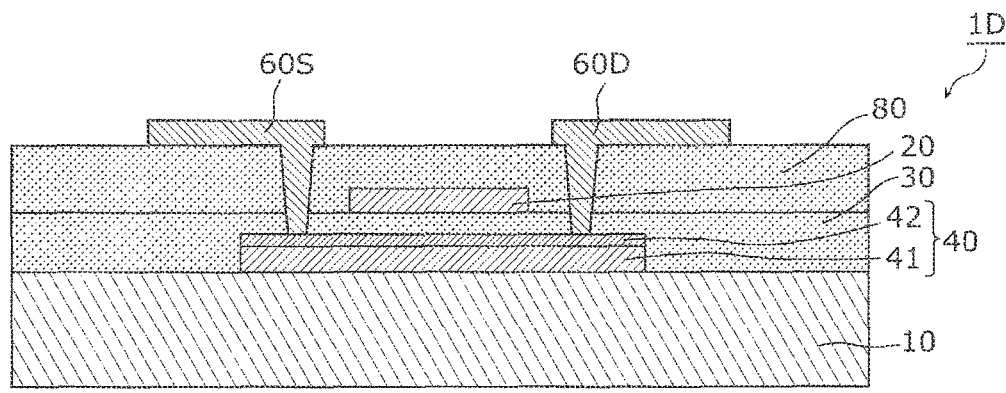
FIG. 21 is a cross-sectional view of a thin film transistor according to Modification 2.

FIG. 21 is a cross-sectional view of a thin film transistor 1D according to Modification 2.

As shown in FIG. 21, the thin film transistor 1D of the present modification is a top-gate TFT, and includes a substrate 10, a gate electrode 20, a gate insulation film 30, an oxide semiconductor layer 40, a source electrode 60S and a drain electrode 60D, and an insulation layer 80.

In the present modification, the oxide semiconductor layer 40 has the same configuration as the oxide semiconductor layer 40 of Embodiment 1. That is, the oxide semiconductor layer 40 is composed of a first oxide semiconductor layer 41 and a second oxide semiconductor layer 42. Also, the oxide semiconductor layer 40 is formed at a position opposing the gate electrode 20 in Embodiment 1, but in the present modification, the oxide semiconductor layer 40 is formed on the substrate 10. The method for forming the oxide semiconductor layer 40 is the same as that used in Embodiment 1.

The gate insulation film 30 is formed between the gate electrode 20 and the oxide semiconductor layer 40 as in Embodiment 1, and in addition, in the present modification, the gate insulation film 30 is deposited on the substrate 10 so as to cover the oxide semiconductor layer 40. Also, the gate electrode 20 is formed on the gate insulation film 30.

The insulation layer 80 is an interlayer insulation layer, and is deposited on the gate insulation film 30 so as to cover the gate electrode 20.

Contact holes for connecting the oxide semiconductor layer 40 to the source electrode 60S and the drain electrode 60D are formed in a portion of the insulation layer 80 and the gate insulation film 30.

The source electrode 60S and the drain electrode 60D are formed in a predetermined shape on the insulation layer 80. Also, the source electrode 60S and the drain electrode 60D are connected to the oxide semiconductor layer 40 via the contact holes formed in the insulation layer 80 and the gate insulation film 30.

As described above, Embodiments 1 and 2 employ a bottom-gate structure, but as in the present modification, a top-gate structure may be used.

With the method for producing a thin film transistor 1D of the present modification described above, the same effects as those of Embodiment 1 can be obtained. Note that the present modification can also be applied to Embodiments 2 and 3.

(Other Modifications, Etc.)

In the foregoing, thin film transistors and methods for producing the film transistors have been described by way of embodiments and modifications, but the present invention is not limited to the embodiments and modifications given above.

For example, in the embodiments and modifications given above, an amorphous oxide semiconductor, namely, $InGaZnO_X$ (IGZO) is used as the oxide semiconductor used to form the oxide semiconductor layer, but the present disclosure is not limited thereto, and it is also possible to use a polycrystalline oxide semiconductor such as InGaO.

Also, the embodiments and modifications given above have been described by using an organic EL display apparatus as the display apparatus that uses the thin film transistor, but the present disclosure is not limited thereto. For example, the thin film transistors of the embodiments and modifications given above can also be applied to other display apparatuses such as a liquid crystal display apparatus.

In this case, the organic EL display apparatus (organic EL panel) can be used as a flat panel display. For example, the organic EL display apparatus can be used as a display panel in various electronic devices such as a television set, a personal computer or a mobile phone.

The present invention also encompasses other embodiments obtained by making various modifications conceived by a person skilled in the art to the embodiments and modifications disclosed herein, as well as embodiments implemented by any combination of the structural elements and functions of the embodiments and modifications disclosed herein without departing from the scope of the present invention.

INDUSTRIAL APPLICABILITY

The techniques disclosed herein are useful for thin film transistors and methods for producing a thin film transistor, and can be widely used in a display apparatus using a thin film transistor such as an organic EL display apparatus, or other various electronic devices using a thin film transistor.

REFERENCE SIGNS LIST 1, 1A, 1B, 1C, 1D Thin Film Transistor
10 Substrate
20 Gate electrode
30 Gate insulation film
40, 40A, 40B Oxide semiconductor layer
40a Oxide semiconductor film
41, 41A, 41B First oxide semiconductor layer
41a First oxide semiconductor film
42, 42A, 42B Second oxide semiconductor layer
42a Second oxide semiconductor film
43B Third oxide semiconductor layer
50, 70, 80 Insulation layer
60S Source electrode
60D Drain electrode
100 Organic EL display apparatus
110 TFT substrate
120 Pixel
130 Organic EL element
131 Anode
132 EL layer
133 Cathode
140 Gate line
150 Source line
160 Power supply line

The invention claimed is:

1. A method for producing a thin film transistor including an oxide semiconductor layer, the method comprising:
depositing an oxide semiconductor film above a substrate by a sputtering method; and
forming the oxide semiconductor layer into a predetermined shape by processing the oxide semiconductor film,
wherein, in the depositing of the oxide semiconductor film, a first oxide semiconductor film is deposited by using a first power density, and a second oxide semiconductor film is deposited on the first oxide semiconductor film by using a second power density different from the first power density,
the first oxide semiconductor film has a thickness of 10 nm or more, and
the second oxide semiconductor film has a thickness of 5 nm or less.

2. The method for producing a thin film transistor according to claim 1,
wherein the second power density is greater than the first power density.

3. The method for producing a thin film transistor according to claim 2,
wherein the second power density is 110% or more of the first power density.

4. The method for producing a thin film transistor according to claim 1, comprising:
forming a gate electrode above the substrate;
forming a gate insulation film on the gate electrode;
forming the oxide semiconductor film on the gate insulation film in the depositing of the oxide semiconductor film;
forming the oxide semiconductor layer into a predetermined shape by processing the oxide semiconductor film in the forming of the oxide semiconductor layer;
forming an insulation layer on the oxide semiconductor layer so as to expose a portion of the oxide semiconductor layer; and
forming a source electrode and a drain electrode on the insulation layer so as to be connected to the exposed portion of the oxide semiconductor layer.

5. The method for producing a thin film transistor according to claim 1,
wherein the oxide semiconductor film includes a transparent amorphous oxide semiconductor.

6. The method for producing a thin film transistor according to claim 5,
wherein the transparent amorphous oxide semiconductor is InGaZnO.

7. The method for producing a thin film transistor according to claim 1,
wherein the depositing of the oxide semiconductor film includes, in order:
depositing the first oxide semiconductor film using the first power density;
temporarily stopping a plasma discharge;
switching the first power density to the second power density;
restarting the plasma discharge; and
depositing the second oxide semiconductor film using the second power density.

8. The method for producing a thin film transistor according to claim 7,
wherein the first oxide semiconductor film and the second oxide semiconductor film are deposited in a same chamber, and the plasma discharge is temporarily stopped without breaking a vacuum in the same chamber.

9. The method for producing a thin film transistor according to claim 1,
wherein, in the depositing of the oxide semiconductor film, the first power density is changed gradually to the second power density in an analog manner.

10. The method for producing a thin film transistor according to claim 1,
wherein, in the depositing of the oxide semiconductor film, the first power density is switched to the second power density in a digital manner.

11. The method for producing a thin film transistor according to claim 1, further comprising:
forming an insulating layer above the substrate to cover the oxide semiconductor layer, the insulating layer including a three-layer structure of a silicon oxide film, an aluminum oxide film, and a silicon oxide film.

* * * * *

UNITED STATES PATENT AND TRADEMARK OFFICE
CERTIFICATE OF CORRECTION

| | |
|---|---|
| PATENT NO. | : 9,691,906 B2 |
| APPLICATION NO. | : 15/028966 |
| DATED | : June 27, 2017 |
| INVENTOR(S) | : Eiji Takeda et al. |

It is certified that error appears in the above-identified patent and that said Letters Patent is hereby corrected as shown below:

In "OTHER PUBLICATIONS", "Office Action from Japan Patent Office (JPO) in Japanese Patent Appl. No. 2015-543687, dated Apr. 28, 2017." should read --Office Action from Japan Patent Office (JPO) in Japanese Patent Appl. No. 2015-543687, dated Apr. 18, 2017.--.

Signed and Sealed this
Third Day of October, 2017

Joseph Matal
*Performing the Functions and Duties of the*
*Under Secretary of Commerce for Intellectual Property and*
*Director of the United States Patent and Trademark Office*